US010644037B2

(12) United States Patent
Su et al.

(10) Patent No.: US 10,644,037 B2
(45) Date of Patent: May 5, 2020

(54) VIA-HOLE CONNECTION STRUCTURE AND METHOD OF MANUFACTURING THE SAME, AND ARRAY SUBSTRATE AND METHOD OF MANUFACTURING THE SAME

(71) Applicants: BOE Technology Group Co., Ltd., Beijing (CN); Chengdu BOE Optoelectronics Technology Co., Ltd., Chengdu (CN)

(72) Inventors: Lei Su, Beijing (CN); Xiaofei Yang, Beijing (CN); Xu Liu, Beijing (CN); Xun Mou, Beijing (CN); Yawen Zhu, Beijing (CN)

(73) Assignees: BOE TECHNOLOGY GROUP CO., LTD., Beijing (CN); CHENGDU BOE OPTOELETRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/935,213

(22) Filed: Mar. 26, 2018

(65) Prior Publication Data
US 2019/0131316 A1 May 2, 2019

(30) Foreign Application Priority Data
Nov. 1, 2017 (CN) .......................... 2017 1 1058192

(51) Int. Cl.
*H01L 21/00* (2006.01)
*H01L 27/12* (2006.01)
(Continued)

(52) U.S. Cl.
CPC ...... *H01L 27/124* (2013.01); *H01L 21/31144* (2013.01); *H01L 21/32139* (2013.01);
(Continued)

(58) Field of Classification Search
CPC .......................... H01L 21/31144; H01L 27/124
(Continued)

(56) References Cited

U.S. PATENT DOCUMENTS 9,116,383 B2   8/2015   Liu et al.
9,864,246 B2   1/2018   Fu
(Continued)

FOREIGN PATENT DOCUMENTS

CN    103226286 A    7/2013
CN    104777690 A    7/2015
(Continued)

OTHER PUBLICATIONS

First Office Action, including Search Report, for Chinese Patent Application No. 201711058192.1, dated Sep. 30, 2019, 24 pages.

*Primary Examiner* — Ajay Arora
(74) *Attorney, Agent, or Firm* — Westman, Champlin & Koehler, P.A.

(57) ABSTRACT

The present disclosure relates to a via-hole connection structure and a method of manufacturing the same and an array substrate and a method of manufacturing the same. In an embodiment, a method of manufacturing a via-hole connection structure, includes the following steps of: forming a first conductive layer on a substrate, and patterning the first conductive layer to form a first conductive pattern on which a first photoresist pattern is provided; forming a first insulation layer covering the first conductive layer and the first photoresist pattern; patterning the first insulation layer to form a first via-hole from which at least a portion of the first photoresist pattern is exposed; removing the at least a portion of the first photoresist pattern exposed from the first via-hole; and forming a second conductive pattern, wherein the second conductive pattern is electrically connected to the first conductive pattern through the first via-hole.

16 Claims, 16 Drawing Sheets

(51) Int. Cl.
*H01L 21/768* (2006.01)
*H01L 23/522* (2006.01)
*H01L 21/3213* (2006.01)
*H01L 21/311* (2006.01)

(52) U.S. Cl.
CPC .. *H01L 21/76802* (2013.01); *H01L 21/76877* (2013.01); *H01L 23/5226* (2013.01); *H01L 27/1248* (2013.01)

(58) Field of Classification Search
USPC .......................................................... 438/48
See application file for complete search history.

(56) References Cited

U.S. PATENT DOCUMENTS

| | | | | |
|---|---|---|---|---|
| 2004/0002210 | A1* | 1/2004 | Goldberg | H01L 21/76808 438/637 |
| 2005/0253171 | A1* | 11/2005 | Kang | H01L 27/3246 257/211 |
| 2009/0061571 | A1* | 3/2009 | Li | G02F 1/136213 438/155 |
| 2009/0081418 | A1* | 3/2009 | Allen | H01L 21/02137 428/195.1 |
| 2011/0085122 | A1* | 4/2011 | Fu | G02F 1/13338 349/149 |
| 2012/0049198 | A1 | 3/2012 | Chang | |
| 2014/0061635 | A1* | 3/2014 | Liu | H01L 29/66765 257/43 |
| 2015/0123136 | A1* | 5/2015 | Kim | G02F 1/13454 257/72 |
| 2015/0144589 | A1* | 5/2015 | Liu | H01L 27/1288 216/13 |
| 2017/0192327 | A1 | 7/2017 | Fu | |

FOREIGN PATENT DOCUMENTS

| | | | |
|---|---|---|---|
| CN | 105070687 A | * | 11/2015 |
| CN | 106783894 A | | 5/2017 |

* cited by examiner

VIA-HOLE CONNECTION STRUCTURE AND METHOD OF MANUFACTURING THE SAME, AND ARRAY SUBSTRATE AND METHOD OF MANUFACTURING THE SAME

CROSS-REFERENCE TO RELATED APPLICATION

This application claims priority to Chinese Patent Application No. 201711058192.1 filed on Nov. 1, 2017 in the State Intellectual Property Office of China, the disclosure of which is hereby incorporated by reference in its entirety.

TECHNICAL FIELD

The present disclosure relates to a via-hole connection structure and a method of manufacturing the same and an array substrate and a method of manufacturing the same.

BACKGROUND

Thin film transistor-liquid crystal display (TFT-LCD) device is one of the main flat panel display (FPD) devices. A TFT-LCD array substrate comprises a display region and a peripheral region. In the display region, gate lines and data lines intersect each other to define a plurality of pixel units. The gate line and the data line are connected respectively to a scan driver and a data driver through fan-out lines in a fan-out area of the peripheral region of the array substrate. Usually, a via-hole connection structure is formed, by etching, over the fan-out line, however, the etching process is easy to cause damage to the fan-out line.

SUMMARY

According to an aspect of the present disclosure, there is provided a method of manufacturing a via-hole connection structure. The method comprises the following steps of: forming a first conductive layer on a substrate, and patterning the first conductive layer to form a first conductive pattern on which a first photoresist pattern is provided; forming a first insulation layer covering the first conductive layer and the first photoresist pattern; patterning the first insulation layer to form a first via-hole from which at least a portion of the first photoresist pattern is exposed; removing the at least a portion of the first photoresist pattern exposed from the first via-hole; and forming a second conductive pattern, wherein the second conductive pattern is electrically connected to the first conductive pattern through the first via-hole.

In some embodiments, the step of patterning the first conductive layer to form a first conductive pattern on which a first photoresist pattern is provided comprising: forming a first photoresist layer over the first conductive layer; exposing and developing, with a mask, the first photoresist layer to form the first photoresist pattern; and etching off a portion of the first conductive layer not being covered by the first photoresist pattern, to form the first conductive pattern being covered by the first photoresist pattern; wherein, the first conductive pattern and the first photoresist pattern have the same profile.

In some embodiments, the step of patterning the first conductive layer to form a first conductive pattern on which a first photoresist pattern is provided comprising: forming a first photoresist layer over the first conductive layer; exposing and developing, with a half-tone mask, the first photoresist layer to form a half-tone photoresist pattern; etching off a portion of the first conductive layer not being covered by the half-tone photoresist pattern, to form the first conductive pattern being covered by the half-tone photoresist pattern; and ashing the half-tone photoresist pattern, so as to form a first photoresist pattern covering at least a portion of the first conductive pattern; wherein, the first conductive pattern and the first photoresist pattern have different profiles, and a half-tone area of the half-tone mask at least corresponds to a portion of the first conductive pattern not being covered by the first photoresist pattern.

In some embodiments, the method further comprises, after the step of forming the first insulation layer and before the step of removing the at least a portion of the first photoresist pattern exposed from the first via-hole, further comprising: forming a third conductive pattern and a second insulation layer on the first insulation layer in sequence; and patterning the second insulation layer, so as to form the first via-hole running through the first insulation layer and the second insulation layer and a second via-hole running through the second insulation layer, wherein, at least a portion of the first photoresist pattern is exposed from the first via-hole, at least a portion of the third conductive pattern is exposed from the second via-hole, and an orthographic projection of the third conductive pattern onto the substrate is not overlapped with an orthographic projection of the first via-hole onto the substrate; and wherein, the step of forming a second conductive pattern further comprises: connecting the second conductive pattern to the first conductive pattern and the third conductive pattern through the first via-hole and the second via-hole, respectively.

In some embodiments, the step of patterning the first insulation layer comprises: forming a second photoresist layer over the first insulation layer; exposing and developing the second photoresist layer to form a second photoresist pattern; and etching off a portion of the first insulation layer not being covered by the second photoresist pattern, so as to form the first via-hole; wherein, the second photoresist pattern is removed while removing the at least a portion of the first photoresist pattern exposed from the first via-hole.

In some embodiments, the step of patterning the second insulation layer comprises: forming a third photoresist layer over the second insulation layer; exposing and developing the third photoresist layer so as to form a third photoresist pattern; and etching off a portion of the second insulation layer not being covered by the third photoresist pattern, to form the first via-hole and the second via-hole; wherein, the third photoresist pattern is removed while removing the at least a portion of the first photoresist pattern exposed from the first via-hole.

According to another aspect of the present disclosure, there is provided a method of manufacturing an array substrate, the array substrate comprises a display region and a peripheral region around the display region, and a via-hole connection structure is within a fan-out area in the peripheral region of the array substrate; and the method comprises: manufacturing the via-hole connection structure by using the method of the first aspect.

In some embodiments, the first conductive pattern at least comprises a first fan-out line made of the same material as and formed by the same patterning process simultaneously as a gate line in the display region and a gate electrode of a thin film transistor in the display region.

In some embodiments, the second conductive pattern at least comprises a second fan-out line made of the same material as and formed by the same patterning process simultaneously as a pixel electrode or a common electrode in the display region.

According to another aspect of the present disclosure, there is provided a method of manufacturing an array substrate, the array substrate comprises a display region and a peripheral region around the display region, and a via-hole connection structure is within a fan-out area in the peripheral region of the array substrate; and the method comprises: manufacturing the via-hole connection structure by using the method of some embodiments of the first aspect.

In some embodiments, the third conductive pattern is made of the same material as and is formed by the same patterning process simultaneously as a source electrode and a drain electrode of a thin film transistor in the display region.

In some embodiments, the second conductive pattern is made of the same material as and is formed by the same patterning process simultaneously as a pixel electrode or a common electrode in the display region; a third via-hole is formed while forming the first via-hole and the second via-hole, the third via-hole runs through the second insulation layer and exposes at least a portion of the source electrode or the drain electrode, and the pixel electrode is electrically connected to the at least a portion of the source electrode or the drain electrode through the third via-hole.

According to another aspect of the present disclosure, there is provided a via-hole connection structure. The via-hole connection structure comprises a first conductive pattern, a first photoresist pattern, a first insulation layer and a second conductive pattern laminated in sequence on a substrate; the second conductive pattern is electrically connected to the first conductive pattern through a first via-hole running through the first photoresist pattern and the first insulation layer.

In some embodiments, the via-hole connection structure further comprise a third conductive pattern on the first insulation layer and a second insulation layer on the third conductive pattern; the second conductive pattern is on the second insulation layer, the first via-hole runs through the first photoresist pattern, the first insulation layer and the second insulation layer; an orthographic projection of the third conductive pattern onto the substrate is not overlapped with an orthographic projection of the first via-hole onto the substrate; and, the second conductive pattern is electrically connected to the third conductive pattern through a second via-hole running through the second insulation layer.

In some embodiments, the first conductive pattern and the first photoresist pattern have the same profile.

In some embodiments, the first conductive pattern and the first photoresist pattern have different profiles.

According to another aspect of the present disclosure, there is provided an array substrate. The array substrate comprises a display region and a peripheral region around the display region, the peripheral region comprising a fan-out area, wherein, the fan-out area comprises the via-hole connection structure of the above aspect.

In some embodiments, the first conductive pattern at least comprises a first fan-out line made of the same material as and formed by the same patterning process simultaneously as a gate line in the display region and a gate electrode of a thin film transistor in the display region.

In some embodiments, the second conductive pattern at least comprises a second fan-out line made of the same material as and formed by the same patterning process simultaneously as a pixel electrode or a common electrode in the display region.

BRIEF DESCRIPTION OF THE DRAWINGS

In order to provide a more clear explanation of technical solutions according to embodiments of the present disclosure, there is provided a brief introduction of the attached drawings used in the embodiments hereinafter. Obviously, the attached drawings mentioned in the following description are merely used to illustrate some embodiments of the present disclosure, but not to limit the present disclosure.

FIGS. 6A-6I are schematic views showing configurations formed in steps of the method of manufacturing a via-hole connection structure according to the embodiment of the present disclosure, respectively.

DETAILED DESCRIPTION OF THE EMBODIMENTS

In order to provide a more clear understanding of objects, technique solutions and advantages of embodiments of the present disclosure, technique solutions of embodiments of the present disclosure will be described clearly and completely hereinafter in conjunction with the attached drawings mentioned in embodiments of the present disclosure. Obviously, the embodiments illustrated in these drawings are only some of embodiments of the present disclosure, instead of all of the embodiments of the present disclosure. For those skilled in the art, all other embodiments achieved by referring to the following embodiments of the present disclosure without involving any inventive steps fall into the scope of the present disclosure.

Unless otherwise specified definitions, technical terminologies or scientific terminologies adopted in the present disclosure should indicate common meanings in the art, as being understood by those skilled in the art. Terminologies, such as "first", "second" and the likes adopted in the present disclosure are only for distinguishing one component from another component, instead of expressing or implying that there is any sequence, quantity or importance among them. Moreover, terminologies, such as "one", "a/an" or "the" and the likes only indicate existence of at least one, instead of limiting the quantity. Terminologies "comprise", "include" and any other variations are adopted to indicate a non-exclusive inclusion, that is, an element or an article which presents before such terminology contains element(s) or article(s) and their equivalents listed after this terminology. Terminologies "connect to" or "connect with" and the likes should be explained and illustrated in a broad sense, for example, it can be a mechanical or physical connection, or it can be an electrical connection; or else, it can be a direction connection or an indirect connection with an intermediate agency. Terminologies "upper", "lower", "left", "right" and the likes merely indicate relatively positional relationships, which may be changed correspondingly depending on change of an absolute position of an object to be described.

Figure 1:
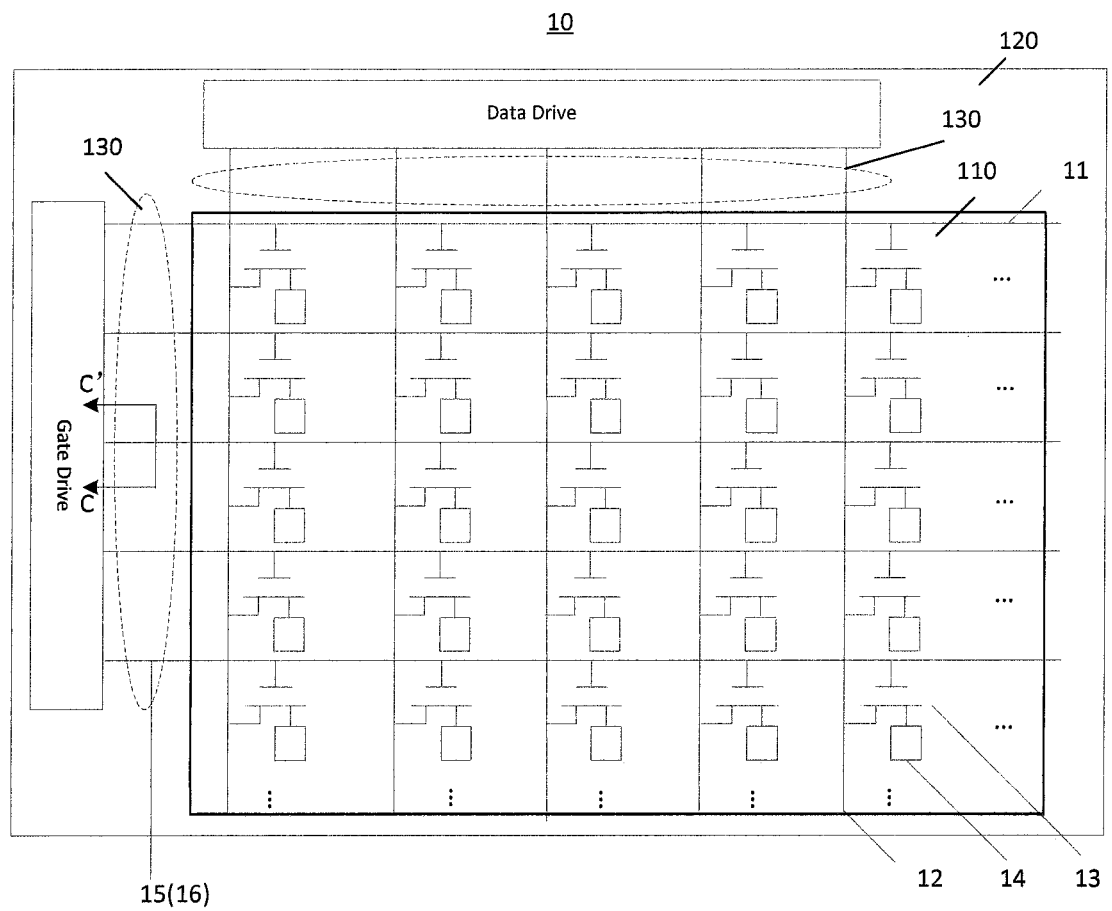
FIG. 1 shows a schematic plan view of an array substrate of a liquid crystal display device.
Figure 2:
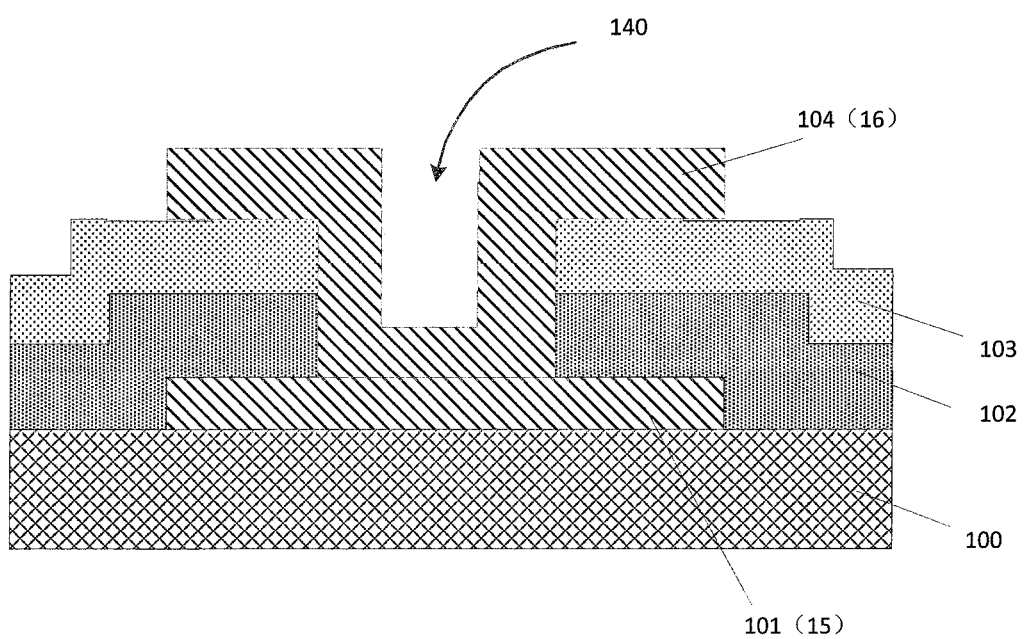
FIG. 2 is a sectional view of the array substrate shown in FIG. 1 along a section line C-C'.

Please referring to FIG. 1 and FIG. 2 together, FIG. 1 shows a schematic plan view of an array substrate 10 of a liquid crystal display device, FIG. 2 is a sectional view of FIG. 1 along a section line C-C'. As shown in FIG. 1, the array substrate 10 comprises a display region 110 and a peripheral region 120. In the display region 110, a plurality of gate lines 11 in parallel and a plurality of data lines 12 in parallel intersect each other to define a plurality of pixel units. Each pixel unit can comprise a thin film transistor 13 and a pixel electrode 14. A gate electrode of the thin film transistor 13 is connected to the gate line 11, a source electrode and a drain electrode of the thin film transistor 13 are connected to the data line 12 and the pixel electrode 14, respectively. The plurality of gate lines 11 and the plurality of data lines 12 are connected respectively to a scan driver and a data driver in the peripheral region 120 of the array substrate 10 via corresponding lines, which are commonly named as fan-out lines. As shown in FIG. 1 and FIG. 2, the fan-out lines comprises a plurality of first fan-out lines 15 connected to corresponding gate lines or data lines and a plurality of second fan-out lines 16 connected to the scan driver or the data driver, and each first fan-out line 15 and the corresponding second fan-out line 16 are electrically connected with each other through a via-hole connection structure, such that the gate lines and the data lines are connected to the scan driver and the data driver, respectively. An area where the first fan-out lines 15 and the second fan-out lines 16 are connected is commonly named as a fan-out area 130.

A method of manufacturing an array substrate, for example, comprises the following steps S101 to S107, which are described and explained in detail hereinafter in conjunction with FIG. 1 and FIG. 2.

Step S101 is to form a first conductive layer 101 on a substrate 100, and to pattern the first conductive layer 101 to form a gate electrode of the thin film transistor 13, a gate line 11 and a first fan-out line 15.

The first conductive layer 101 can have monolayer metal structure or double-layer metal structure, for example, the first conductive layer 101 is a double-layer material structure of Aluminum-Neodymium alloy and Molybdenum.

Step S102 is to form an insulation layer 102 covering the whole substrate and thereby covering the first fan-out line 15. The insulation layer 102 is also a gate insulation layer of the thin film transistor.

Step S103 is to form a semi-conductor layer, and to pattern it to form an active layer of the thin film transistor.

Step S104 is to form a second conductive layer, and to pattern it to form a source electrode and a drain electrode of the thin film transistor and a plurality of data lines 12. For example, the data line is electrically connected to the source electrode of the thin film transistor.

Step S105 is to form a passivation layer 103 covering the whole substrate and thereby covering the formed thin film transistor 13 and the data line 12 and the likes.

Step S106 is to implement a pattern process on the passivation layer 103 to form therein a plurality of via-holes including a first via-hole 140 in an area to which the first fan-out line 15 corresponds and a second via-hole in an area to which the drain electrode of the thin film transistor corresponds, the first via-hole 140 running through the passivation layer 103 and the insulation layer 102 and exposing a portion of the first fan-out line 15, and the second via-hole running through the passivation layer 103 and exposing a portion of the drain electrode of the thin film transistor. For example, the pattern processes commonly include exposure, development and etching and the likes.

Step S107 is to form a third conductive layer 104, and to pattern it to form a pixel electrode 14 and a second fan-out line 16, the pixel electrode 14 extending into the second via-hole and being connected to the drain electrode of the thin film transistor, and the second fan-out line 16 extending into the first via-hole 140 and being connected with the first fan-out line 15, so that the first fan-out line 15 is further connected to the scan driver or the data driver. For example, the third conductive layer 104 is a transparent conductive layer.

In study, it is found by the inventor of the present application that, when an etching process for formation of the first via-hole 140 is implemented, this etching process can easily damage the first fan-out line 15 that has been formed. For example, when a double-layer structure of Aluminum-Neodymium alloy and Molybdenum is adopted as material for the first fan-out line and a dry etching is used to form the via hole, an over-etching is required sometimes, however, due to technological fluctuation, bombardment of dry etching particles can easily damage the upper layer of molybdenum, and, the third conductive layer 104 lacks compactness as it is made of such as ITO material, so that water vapor in the environment can permeate easily into the via-hole and corrode the layer of Aluminum-Neodymium alloy, resulting in poor contact.

A via-hole connection structure and a method of manufacturing the same and an array substrate and a method of manufacturing the same are provided according to embodiments of the present disclosure. In the embodiments of the present disclosure, a photoresist layer formed when patterning the first conductive layer is used to protect the first conductive layer in the etching process for formation of the via-hole from being damaged, meanwhile, the photoresist layer can be removed in a photoresist layer removing process after performing the etching process for formation of the via-hole, thus, an anti-corrosion effect can be achieved without increasing the number of masks for manufacturing the array substrate.

Figure 3:
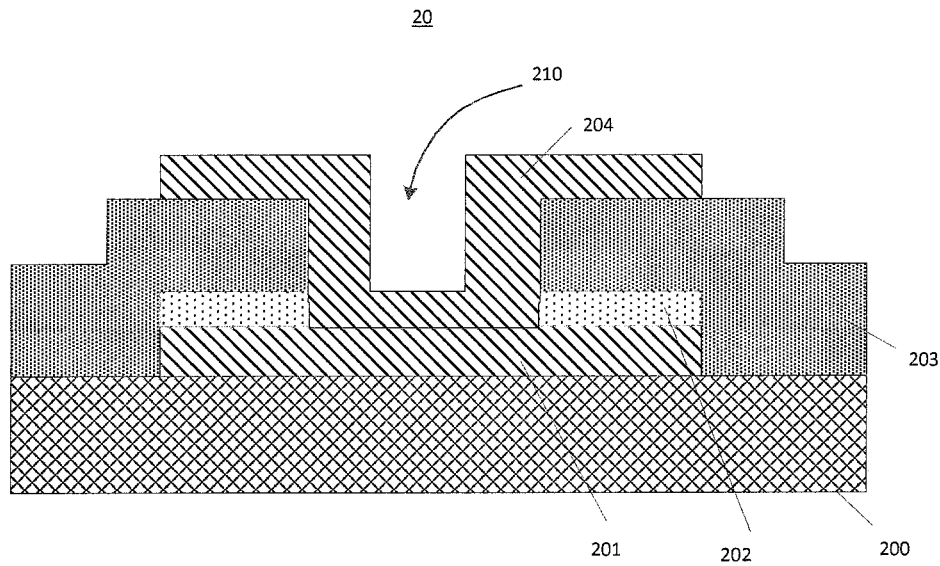
FIG. 3 is a sectional view of a via-hole connection structure according to an embodiment of the present disclosure.

FIG. 3 is a sectional view of a via-hole connection structure 20 according to an embodiment of the present disclosure the via-hole connection structure 20 comprises a first conductive pattern 201, a first photoresist pattern 202, a first insulation layer 203 and a second conductive pattern 204 laminated in sequence on a substrate 200, and, the second conductive pattern 204 is electrically connected to the first conductive pattern 201 through the first via-hole 210 running through the first photoresist pattern 202 and the first insulation layer 203.

The first conductive pattern 201 can have monolayer metal structure or double-layer metal structure, for example, the first conductive pattern 201 has a double-layer material structure of Aluminum-Neodymium alloy and Molybdenum.

The first photoresist pattern 202 can be formed from positive or negative photoresist material, for example, material for the first photoresist pattern 202 is acrylic.

Material for the second conductive pattern 204 can be metal or transparent conductive oxide materials, such as Indium Tin Oxide (ITO), Indium Zinc Oxide (IZO) and the likes.

Figure 4:
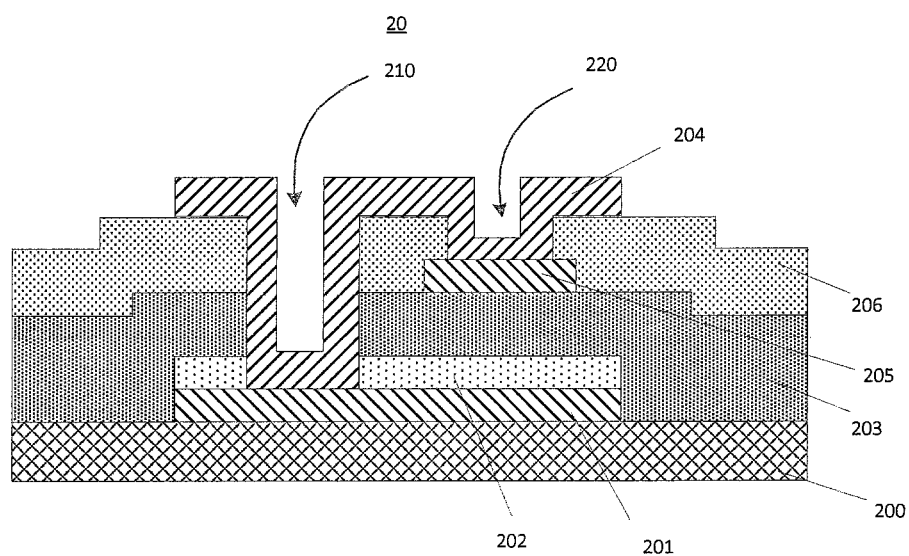
FIG. 4 is a sectional view of a via-hole connection structure according to another embodiment of the present disclosure.

FIG. 4 is a sectional view of a via-hole connection structure 20 according to another embodiment of the present disclosure. Technical contents of the via-hole connection structure according to the present embodiment are the substantially same as those of the via-hole connection structure according to the aforementioned embodiment, excepting the differences as follows. The via-hole connection structure 20 according to the present embodiment further comprises a third conductive pattern 205 and a second insulation layer 206 on the first insulation layer 203, an orthographic projection of the third conductive pattern 205 onto the substrate 200 is not overlapped with an orthographic projection of the first via-hole 210 onto the substrate 200, and a second via-hole 220 corresponding to the third conductive pattern 205 is formed in the second insulation layer 206. The first via-hole 210 runs through the first photoresist pattern 202, the first insulation layer 203 and the second insulation layer 206, and the second conductive pattern 204 is electrically connected with the third conductive pattern 205 through the second via-hole 220 running through the second insulation layer 206, so that the first conductive pattern 201 is electrically connected with the third conductive pattern 205 through the second conductive pattern 204. The number of the second via-hole 220 is at least two. The second conductive pattern 204 is provided to form an electrical connection with the third conductive pattern 205 through the at least two second via-hole 220, so that resistance of the second conductive pattern 204 can be reduced.

Figure 5:
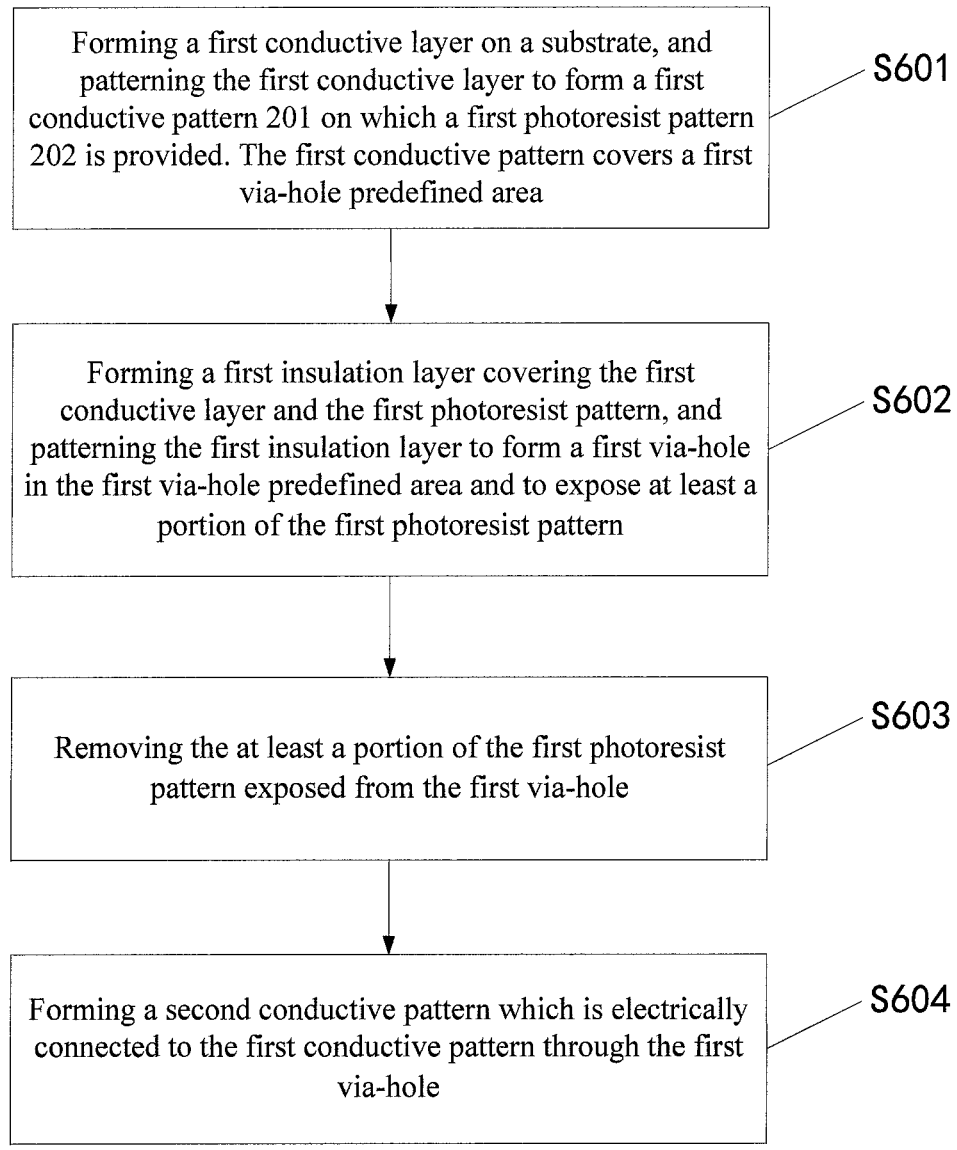
FIG. 5 is a flow diagram of a method of manufacturing a via-hole connection structure according to an embodiment of the present disclosure.

FIG. 5 is a flow diagram of a method of manufacturing a via-hole connection structure according to an embodiment of the present disclosure, and this manufacturing method will be described and explained hereinafter with reference to FIGS. 6A-6E. The manufacturing method comprises the following steps S601-S604.

Step S601 is to form a first conductive layer on a substrate, and to pattern the first conductive layer to form a first conductive pattern 201 on which a first photoresist pattern 202 is provided. The first conductive pattern covers a first via-hole predefined area (namely, an area where a first via-hole is to be formed).

Figure 6A:
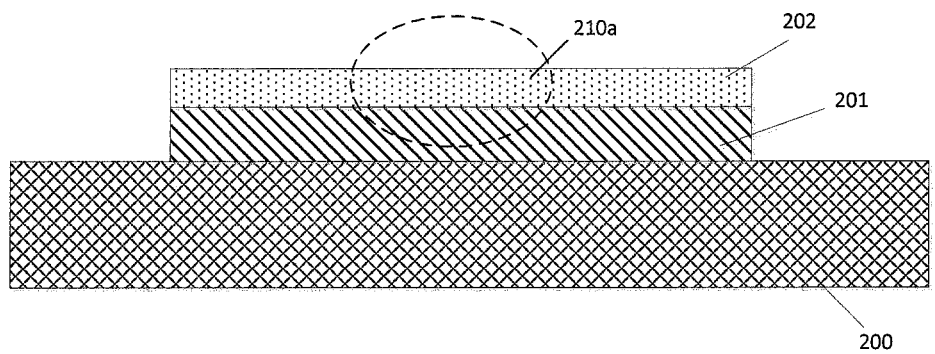

For example, as shown in FIG. 6A, the first conductive layer is formed on the substrate 200 and is then patterned. For example, the first photoresist layer is formed on the first conductive layer and then is exposed and developed to form the first photoresist pattern 202 on the first photoresist layer. The first photoresist pattern 202 covers the first via-hole predefined area 210a. The first conductive layer is etched, by adopting the first photoresist pattern 202 as a mask, to form the first conductive pattern 201. After that, the first photoresist pattern 202 is provided on the formed first conductive pattern 201.

Under this circumstance, the first conductive pattern 201 and the first photoresist pattern 202 can have the same profile.

The substrate 200 can be any of variously suitable substrates, e.g., glass substrate, quartz substrate, plastic substrate and the likes. In addition, in other examples, before forming the first conductive layer, a buffer layer, e.g., silicon oxide, silicon nitride, oxygen silicon nitride and so on, can be formed, which can prevent harmful impurities or ions in the substrate 200 from adversely affecting the first conductive layer.

Step S602 is to form a first insulation layer covering the first conductive layer and the first photoresist pattern, and to pattern the first insulation layer to form a first via-hole in the first via-hole predefined area and to expose at least a portion of the first photoresist pattern.

Figure 6B:
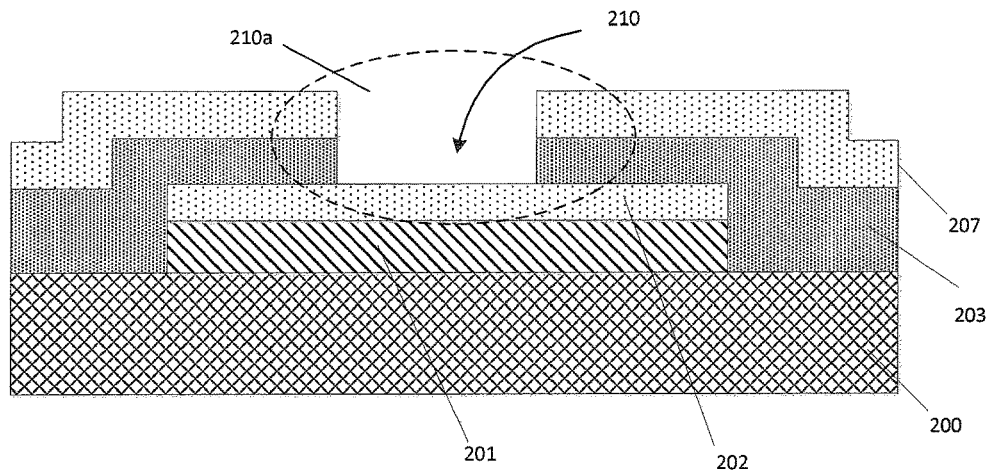

For example, as shown in FIG. 6B, the first insulation layer 203 is formed to cover the first conductive layer 201 and the first photoresist pattern 201, and the first insulation layer 203 is patterned to form the first via-hole 210 in the first via-hole predefined area 210a. Specifically, a second photoresist layer is formed on the first insulation layer 203, and is then exposed and developed to form a second photoresist pattern 207 from the second photoresist layer. And, the first insulation layer 203 is etched, by using the second photoresist pattern 207 as a mask, to form the first via-hole 210 from which at least a portion of the first photoresist pattern is exposed.

Step S603 is to remove the at least a portion of the first photoresist pattern exposed from the first via-hole.

Figure 6C:
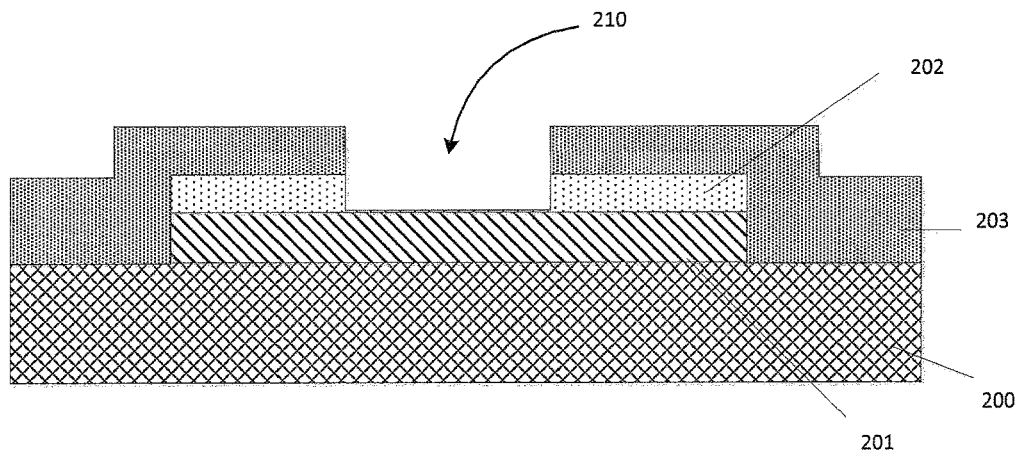

For example, as shown in FIG. 6C, the second photoresist pattern 207 is removed by a photoresist stripping process (for example, an ashing process), also referring to FIG. 6B. At the same time, a portion of the first photoresist pattern corresponding to the first via-hole 210 is removed, thereby a portion of the first conductive pattern 201 is exposed from the first via-hole 210.

Step S604 is to form a second conductive pattern which is electrically connected to the first conductive pattern through the first via-hole.

Figure 6D:
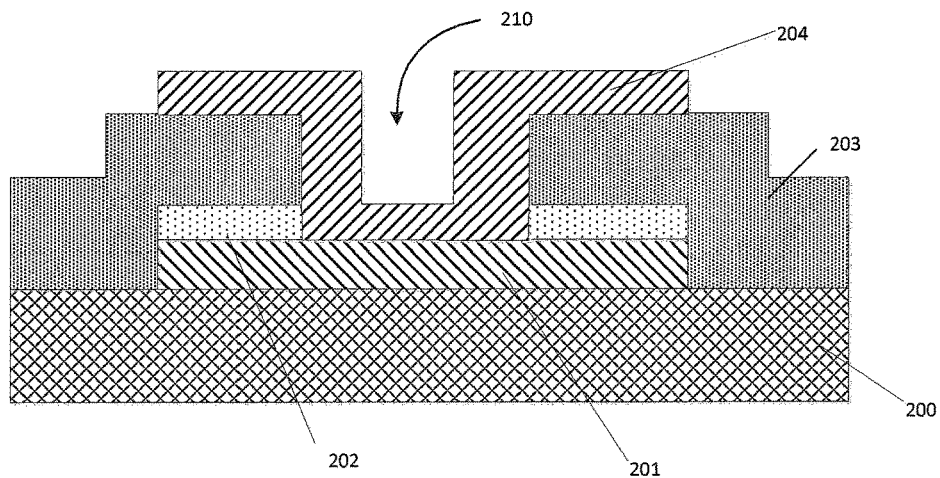

For example, as shown in FIG. 6D, a second conductive layer is formed on the first insulation layer 203. According to requirements, the second conductive layer can be patterned to form a second conductive pattern 204 which forms an electrical connection with the first conductive pattern 201 through the first via-hole 210.

Thus, a via-hole connection structure 20 according to the aforementioned embodiment of the present disclosure, as shown in FIG. 3, is formed.

Alternatively, in one embodiment, in the step S601, a half-tone mask can be used to pattern the first conductive layer. Here, an example in which the first photoresist layer is made of positive photoresist material is described and explained. For example, a transparent region of the half-tone mask corresponds to a region of the first conductive layer to be removed, a non-transparent region of the half-tone mask corresponds to a region of the first conductive layer to be covered with the first photoresist layer, and a semi-transparent region of the half-tone mask corresponds to the rest region of the first conductive layer. In this way, after the first photoresist layer has been exposed and developed, no first photoresist layer is presented in the region of the first conductive layer to be removed. Thickness of the photoresist layer is maximum, e.g., is substantially unchanged, at a section that corresponds to the region of the first conductive layer to be covered with the first photoresist layer; and, thickness of the photoresist layer is intermediate, e.g., is one half of original thickness, at a section that corresponds to the rest region of the first conductive layer.

Figure 6E:
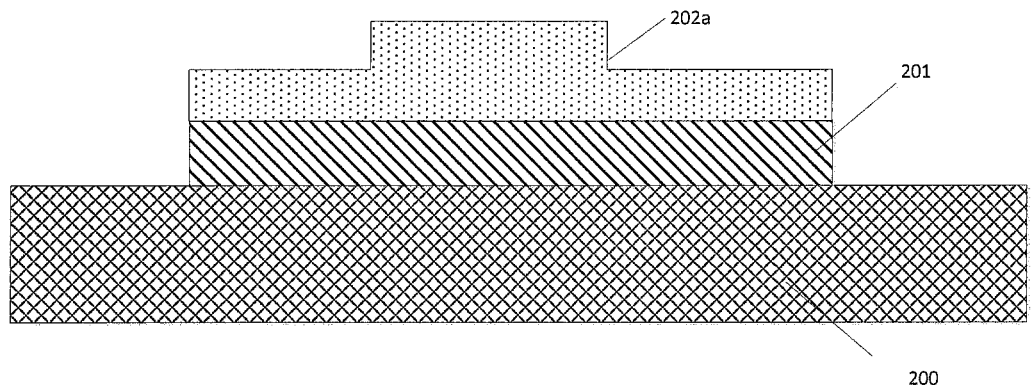
Figure 6F:
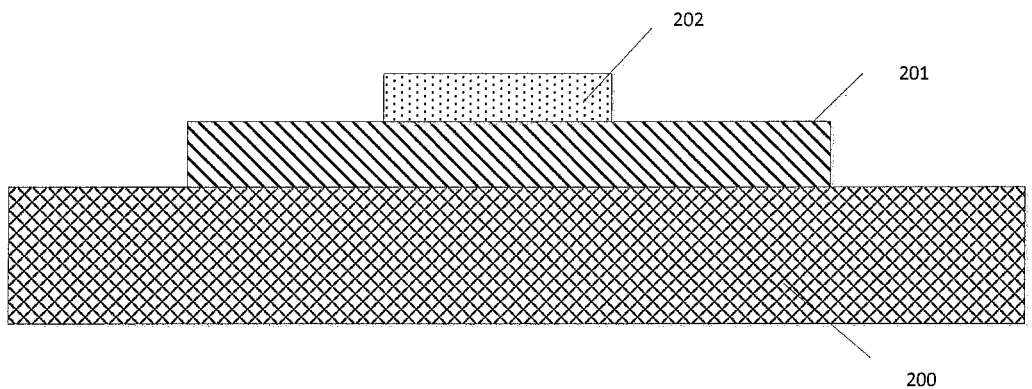

For example, as shown in FIG. 6E, the first photoresist layer is exposed and developed, with a half-tone mask, to form a half-tone photoresist pattern 202a, and the first conductive layer is etched, by using the half-tone photoresist pattern 202a as a mask, to form the first conductive pattern 201. As shown in FIG. 6F, after the first conductive pattern 201 has been formed, an ashing process is implemented on the half-tone photoresist pattern 202a to form a first photoresist pattern 202 that covers a first via-hole predefined area. After that, the first via-hole and the second conductive layer and the likes are formed. In the present embodiment, by means of using the half-tone mask, the first conductive pattern 201 and the first photoresist pattern 202 have different profiles, the first photoresist pattern 202 can cover other areas than the first via-hole predefined area, and the first photoresist pattern 202 can only covers the first via-hole predefined area.

Figure 6G:
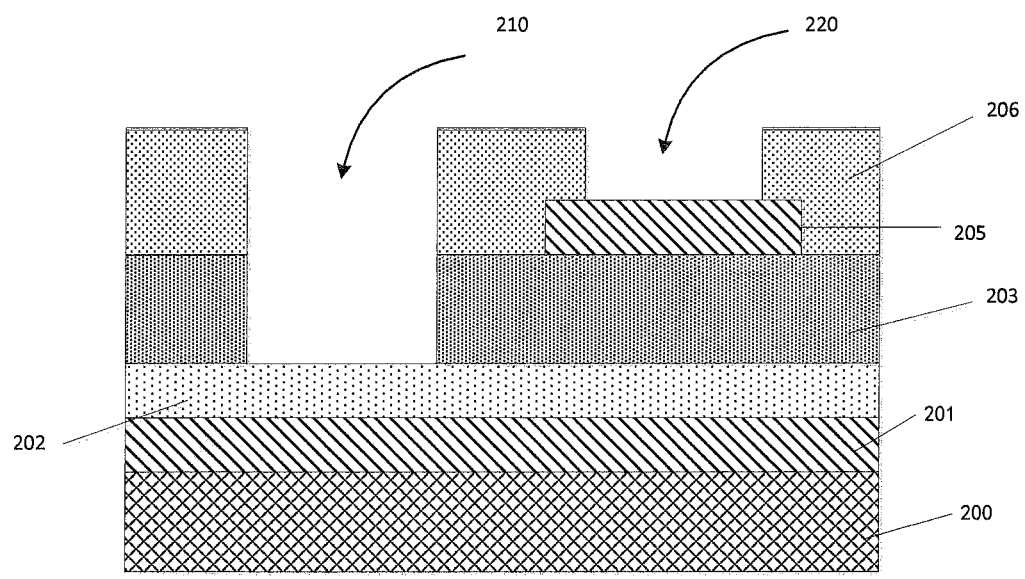
Figure 6I:
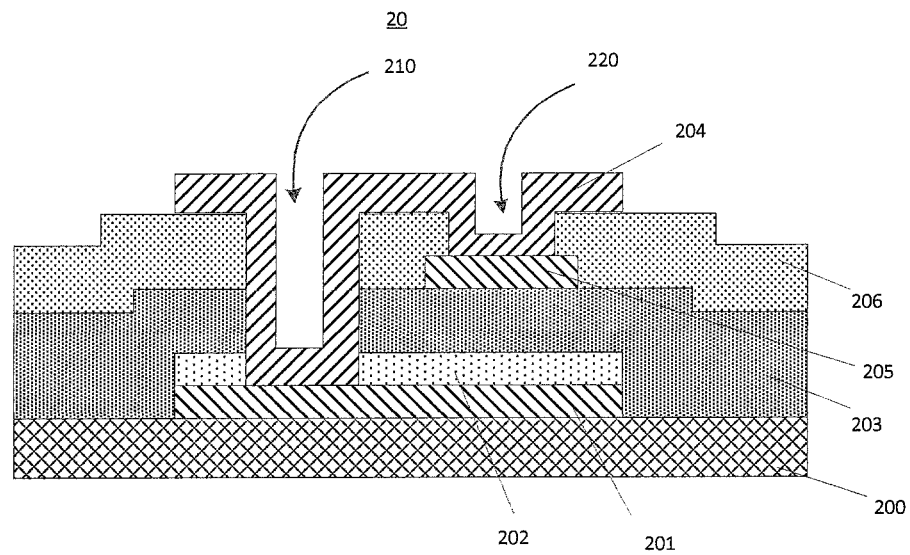

Alternatively, in another embodiment, as shown in FIGS. 6G-6I, after the step of forming the first insulation layer 203 and before the step of removing the at least a portion of the first photoresist pattern exposed from the first via-hole 210, the method further comprises: forming a third conductive pattern 205 and a second insulation layer 206 on the first insulation layer 203 in sequence, wherein an orthographic projection of the third conductive pattern 205 onto the substrate 200 is not overlapped with an orthographic projection of the first via-hole predefined area 210a onto the substrate; forming a third photoresist layer on the second insulation layer 206; exposing and developing the third photoresist layer to form a third photoresist pattern; etching off, by using the third photoresist pattern, portions of the second insulation layer 206 and the first insulation layer 203 at the first via-hole predefined area 210a, to form the first via-hole 210 running through the first insulation layer 203 and the second insulation layer 206; and also, etching off, by using the third photoresist pattern, a portion of the second insulation layer 206 at a position corresponding to the third conductive layer 205, to form the second via-hole 220 running through the second insulation layer 206.

In the present embodiment, the third photoresist pattern is removed by a photoresist stripping process (for example, an ashing process). At the same time, a portion of the first photoresist pattern corresponding to the first via-hole 210 is removed.

After that, a second conductive pattern 204 is formed on the second insulation layer 206. The second conductive pattern 204 is in electrical connections with the first conductive pattern 201 and the third conductive pattern 205, through the first via-hole 210 and the second via-hole 220, respectively. As a result, a via-hole connection structure 20 shown in FIG. 6I is formed.

In the method of manufacturing a via-hole connection structure according to the abovementioned embodiments as well as alternative embodiments of the present disclosure, use of a photoresist layer formed when patterning the first conductive layer can protect the first conductive layer in the etching process for formation of the via-hole from being damaged, meanwhile, the photoresist layer can be removed in a photoresist layer removing process after performing the etching process for formation of the via-hole, thus, an anti-corrosion effect can be achieved without increasing the number of masks for manufacturing the array substrate.

An array substrate according to embodiments of the present disclosure is further provided. The array substrate comprises a display region and a peripheral region around the display region, the peripheral region comprises a fan-out area for connections of signal lines, e.g., gate lines or data lines, in the display region to driver circuits, e.g., scan driver and data driver, in the peripheral region. The fan-out area comprises a via-hole connection structure according to aforementioned embodiments of the present disclosure for connections to the signal lines and the driver circuits.

A method of manufacturing an array substrate according to embodiments of the present disclosure is further provided. The array substrate comprises a display region and a peripheral region around the display region, a via-hole connection structure is within a fan-out area in the peripheral region of the array substrate. The manufacturing method comprises: manufacturing the via-hole connection structure by using the method of manufacturing a via-hole connection structure according to aforementioned embodiments of the present disclosure.

The array substrate and the method of manufacturing the same according to the present disclosure are described and illustrated in the following embodiments hereinafter.

Figure 7:
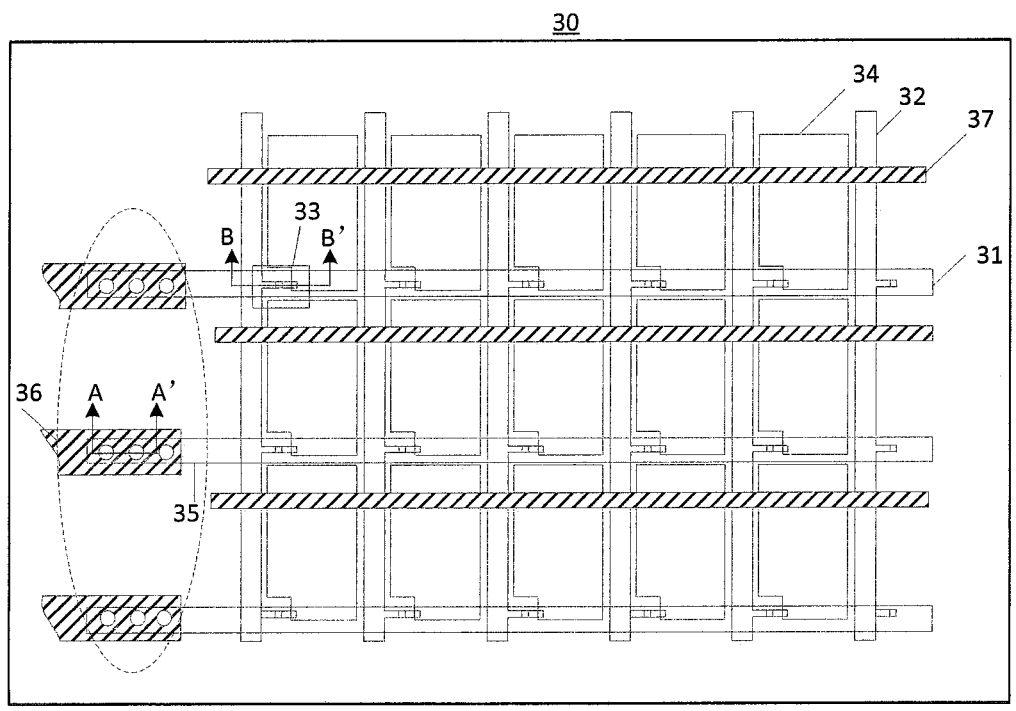
FIG. 7 is a schematic view of an array substrate according to an embodiment of the present disclosure.
Figure 8A:
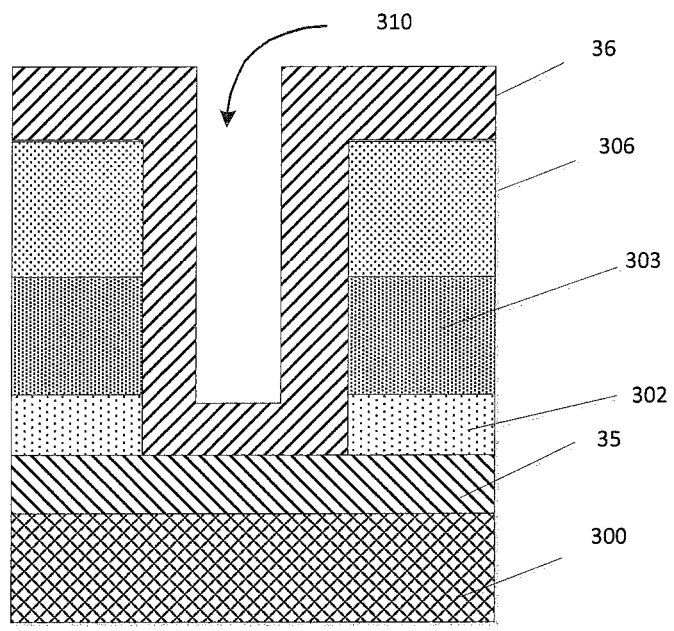
FIGS. 8A-8B are sectional views of the array substrate shown in FIG. 7 along section lines A-A' and B-B', respectively.
Figure 8B:
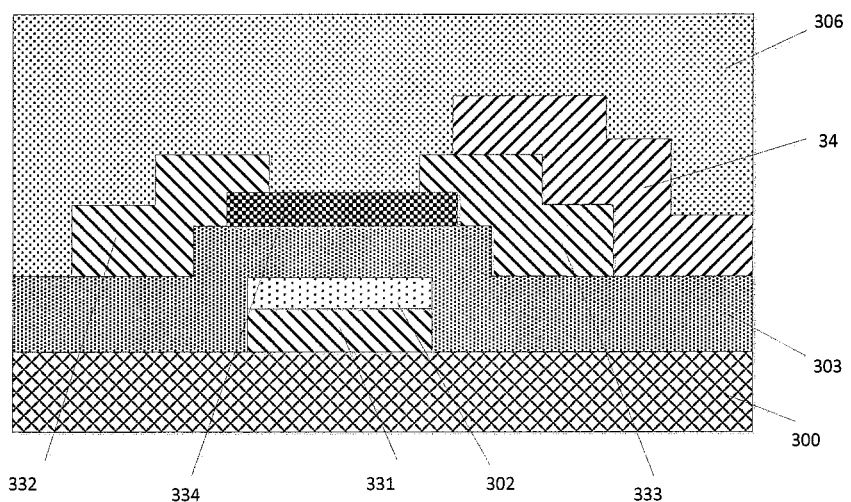

FIG. 7 is a schematic view of an array substrate according to an embodiment of the present disclosure. FIGS. 8A-8B are sectional views of the array substrate shown in FIG. 7 along section lines A-A' and B-B', respectively. FIG. C is a sectional view of an alternative embodiment of the array substrate shown in FIG. 7 along section lines A-A'.

Please referring to FIG. 7 and FIGS. 8A-8B together, the array substrate 30 is a fringing field switch (FFS) type array substrate. The array substrate 30 comprises a plurality of gate lines 31 in parallel and a plurality of data lines 32 in parallel in a display region. The plurality of gate lines 31 and the plurality of data lines 32 intersect each other to define a plurality of pixel units. Each pixel unit comprises a thin film transistor 33 and a pixel electrode 34. A gate electrode of the thin film transistor 33 is connected to the gate line 31, and a first electrode 332 and a second electrode 333 of the thin film transistor 13 are electrically connected to the data line 32 and the pixel electrode 34, respectively. Each gate line or data line is connected to a first fan-out line 35, the first fan-out line 35 is electrically connected to a second fan-out line 36 through a first via-hole 310, and the second fan-out line 36 is connected to a scan driver or a data driver, so that the gate line and the data line are connected to the scan driver and the data driver, respectively. FIG. 7 shows only a fan-out area corresponding to some of the gate lines. In the present embodiment, the first electrode 332 of the thin film transistor 13 is a source electrode, and the second electrode 333 of the thin film transistor 13 is a drain electrode. However, in other embodiments, the two can be interchanged with each other.

The array substrate 30 further comprises a common electrode 37 which is provided in the same layer as the second fan-out line 36. In the present application, "provided in the same layer" denotes that it is formed by patterning a same layer of material in one patterning process.

As shown in FIG. 8A and FIG. 8B, a first photoresist layer 302 is formed on both the first fan-out line 35 in the fan-out area and the gate electrode 331 of the thin film transistor in the pixel unit, and the first via-hole 310 runs through the first photoresist layer 302, the first insulation layer 303 and the second insulation layer 306.

In one embodiment, the first photoresist layer can be provided only on the first fan-out line in the first fan-out line, but no first photoresist layer is provided on the gate electrode of the thin film transistor in the pixel unit.

Figure 8C:
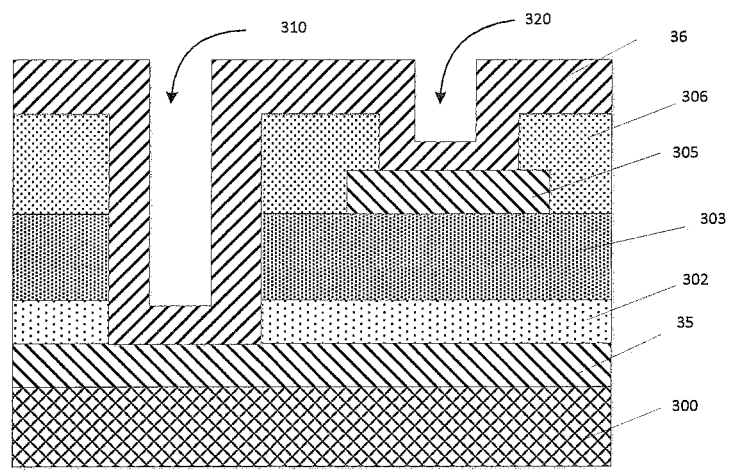
FIG. 8C is a sectional view of an alternative embodiment of the array substrate shown in FIG. 7 along section lines A-A'.

In another embodiment, please referring to FIG. 8C, in the fan-out area, the via-hole connection structure can further comprise a second via-hole 320 running through the second insulation layer 306, and the second fan-out line 36 is connected to a conductive line pattern 305 through the second via-hole 320. For example, the number of the second via-hole is at least two. The second fan-out line 36 is provided to form an electrical connection with the conductive line pattern 305 through the at least two second via-hole, so that resistance of the second fan-out line 36 can be reduced.

For example, in one embodiment, the first fan-out line is provided in the same layer as and is electrically connected with the gate line, that is, the first fan-out line is formed by patterning a gate metal layer. The conductive line pattern 305 is provided in the same layer as the source electrode and the drain electrode of the thin film transistor and is electrically connected with the data line, that is, that is, the conductive line pattern 305 is formed by patterning a source-drain metal layer.

The method of manufacturing an array substrate is described and illustrated hereinafter with reference to FIGS. 9A-9B, FIGS. 10A-10B, FIGS. 11A-11B, FIGS. 12A-12B, FIG. 13 and FIG. 14, in which, FIG. 9A, FIG. 10A, FIG. 11A, FIG. 12A and FIG. 13 show the via-hole connection structure within the fan-out area, and FIG. 9B, FIG. 10B, FIG. 11B, FIG. 12B, and FIG. 14 show structure of a thin film transistor in the display region.

Figure 9A:
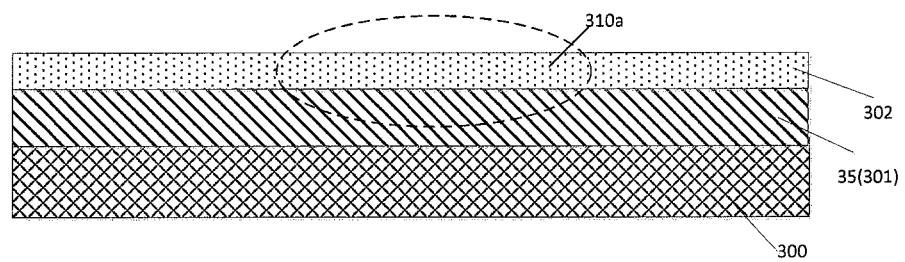
FIGS. 9A-9B, FIGS. 10A-10B, FIGS. 11A-11B, FIGS. 12A-12B, FIG. 13 and FIG. 14 are schematic views showing configurations formed in steps of the method of manufacturing an array substrate as shown in FIG. 8C of the present disclosure, respectively.
Figure 9B:
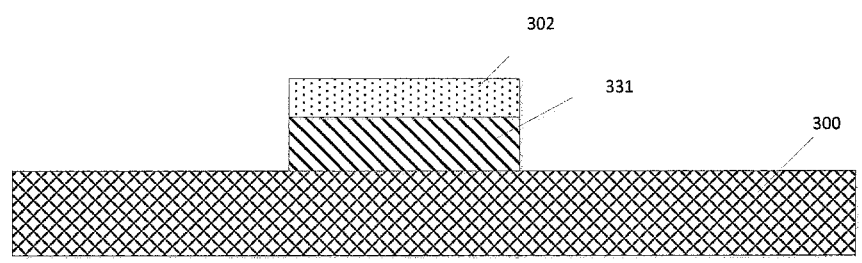

As shown in FIGS. 9A-9B, a first conductive pattern 301 is formed by etching, with the first photoresist pattern 302 as a mask, the first conductive layer. As shown in FIG. 9A, a first via-hole predefined area 310a is located on the first fan-out line 35. The first photoresist pattern 302 is kept back on the first conductive pattern 301.

In the present embodiment, the first conductive pattern 301 can comprise a gate electrode 331 of the thin film transistor in the pixel unit, a gate line in the display region and a first fan-out line 35 in the fan-out area. The first conductive layer can have monolayer metal structure or double-layer metal structure, for example, it is a double-layer material structure of Aluminum-Neodymium alloy and Molybdenum. In an example, the first photoresist pattern 302 can be in consistent with the first conductive pattern 301, the first photoresist layer is disposed both on the first fan-out line 35 and on the gate electrode 331 of the thin film transistor, and masks used in the patterning process are common ones.

Figure 10A:
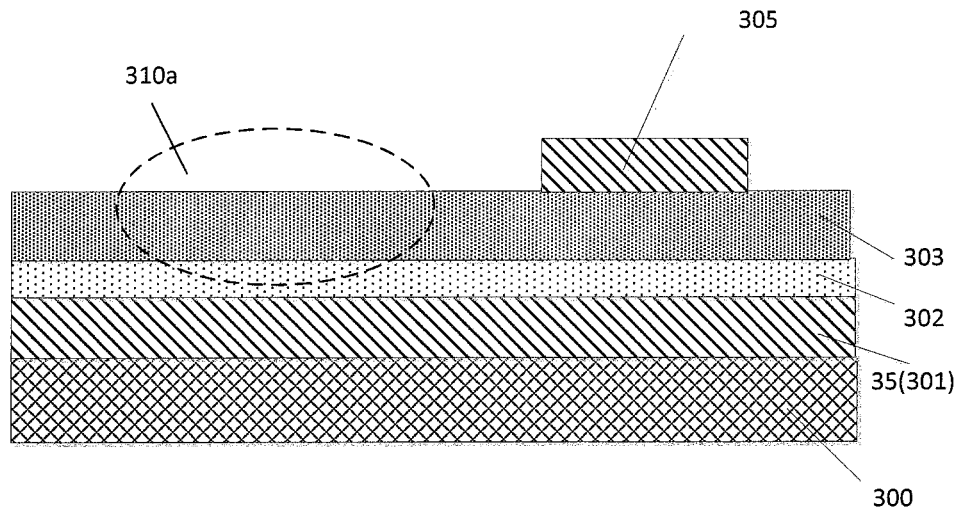
Figure 10B:
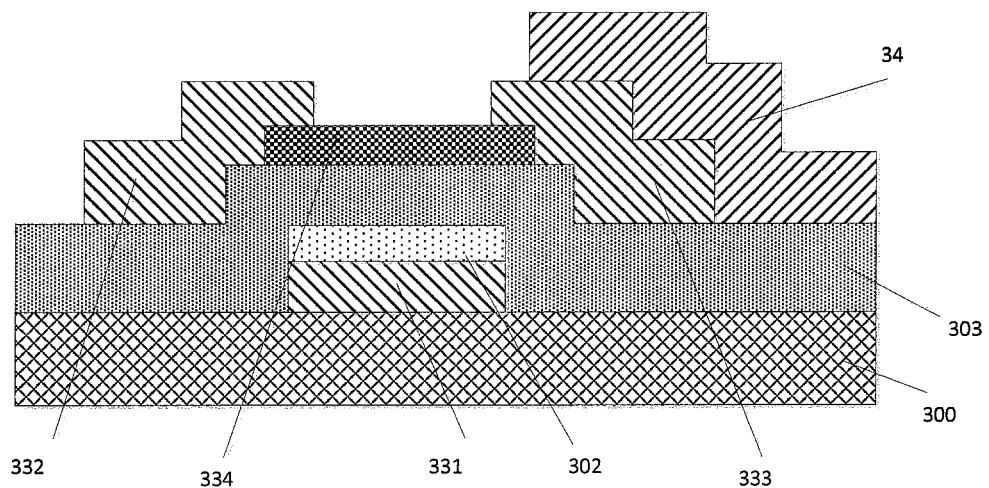

Referring to FIGS. 10A-10B, the first insulation layer 303 is formed to cover the first conductive pattern 301 and the first photoresist pattern 302, and the first insulation layer 303 can work as gate insulation layer of the thin film transistor. Then, a semiconductor layer including an active layer of the thin film transistor is formed. After that, a third conductive layer is formed and patterned to form a third conductive pattern, the later can include: a first electrode 331 (e.g., source electrode) and a second electrode 333 (e.g., drain electrode) of the thin film transistor and a data line, and the likes.

Then, a fourth conductive layer is formed and patterned to form a pixel electrode 34. Electrical connection is created by directly contacting the pixel electrode 34 with the second electrode 333. And, the pixel electrode 34 comprises, for example, structures including slits. The fourth conductive layer is a transparent conductive material, for example, ITO, IZO and the likes.

For example, in one embodiment, the third conductive pattern 305 can further comprise a conductive line pattern 305 insulated from both the source electrode and the drain electrode. An orthographic projection of the conductive line pattern 305 onto the substrate is not overlapped with an orthographic projection of the first via-hole predefined area onto the substrate.

Figure 11A:
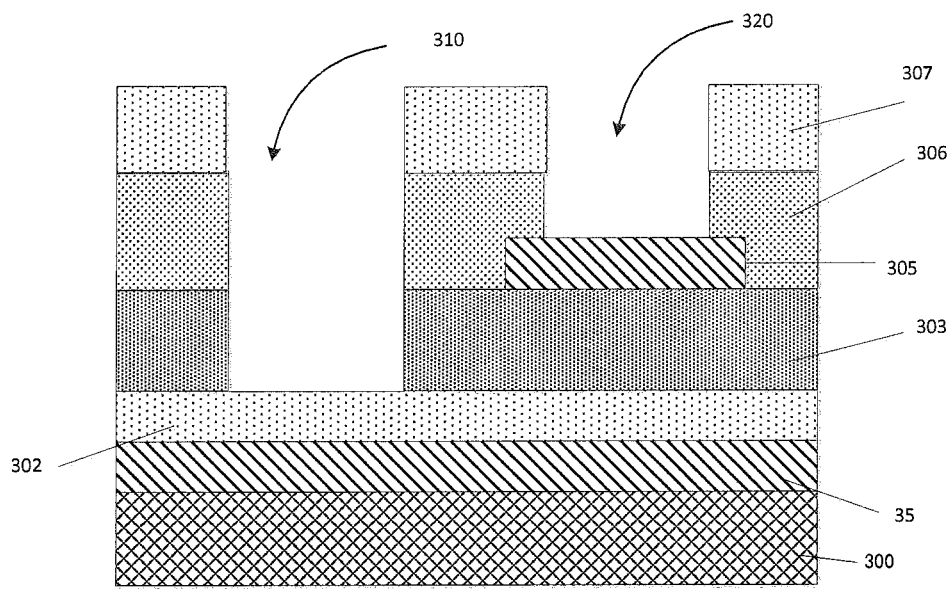
Figure 11B:
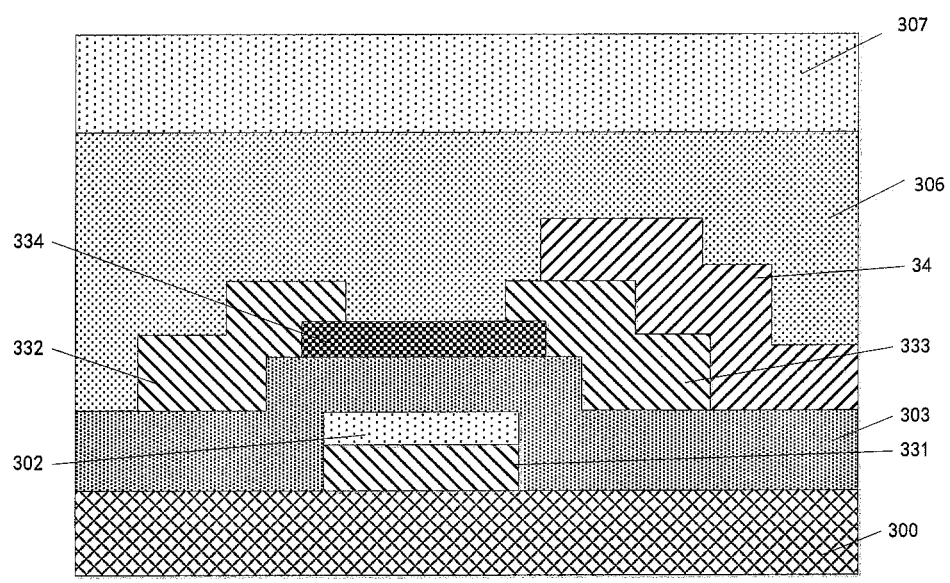

Referring to FIGS. 11A-11B, a second insulation layer 306 is formed and patterned to form a first via-hole 310 within the first via-hole predefined area 310a of the fan-out area (please referring to FIG. 10 together). For example, a third photoresist layer is formed on the second insulation layer 306, and then, is exposed and developed so that a third photoresist pattern 308 is formed from the second photoresist layer. A first via-hole 310 is formed by etching, with the third photoresist pattern 308 as a mask, the first insulation layer 303 and the second insulation layer 306, and the first via-hole 310 runs through the second insulation layer 306 and the first insulation layer 303 and exposes at least a portion of the first photoresist pattern 302.

While forming the first via-hole 310, a second via-hole 320 can be formed in a position corresponding to the conductive line pattern 305, and the second via-hole 320 runs through the second insulation layer 306 and exposes at least a portion of the conductive line pattern 305.

Figure 12A:
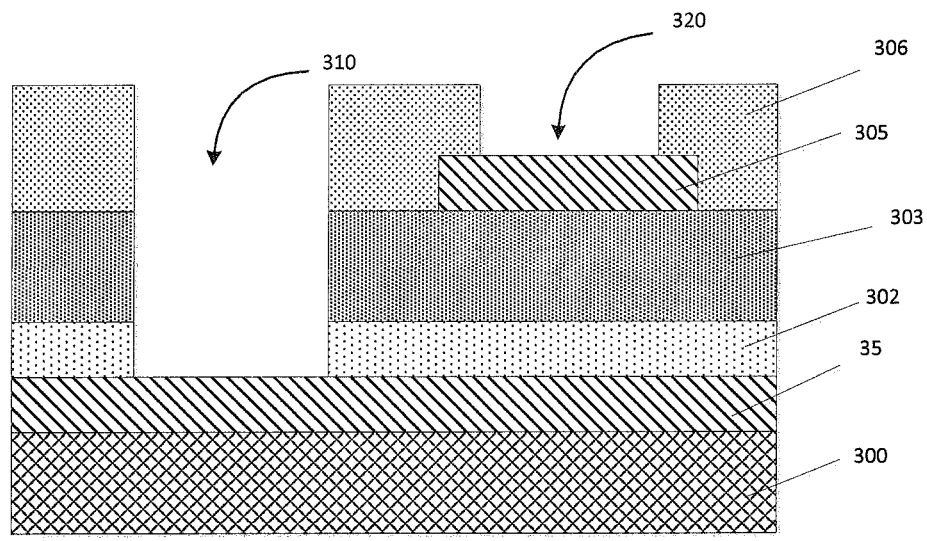
Figure 12B:
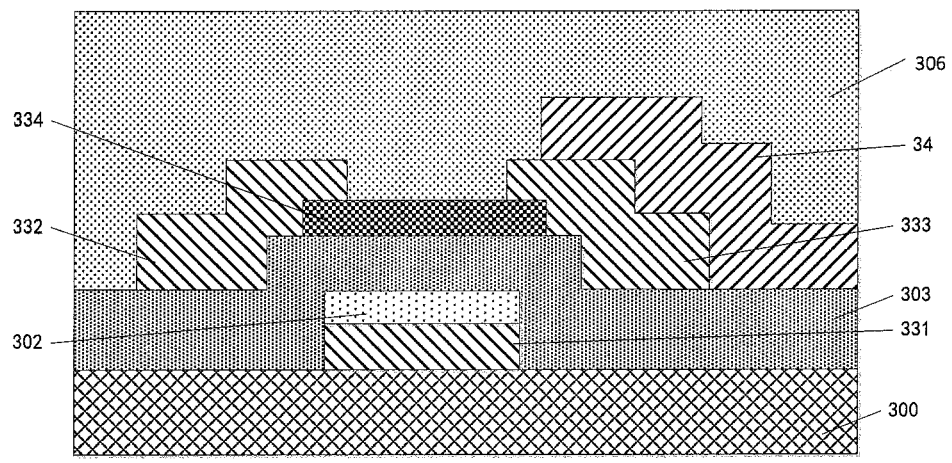

Referring to FIGS. 12A-12B, an ashing process is performed to remove the third photoresist pattern 308, while removing the first photoresist pattern 302 in the first via-hole 310 so as to expose the first fan-out line 35 therebelow.

Figure 13:
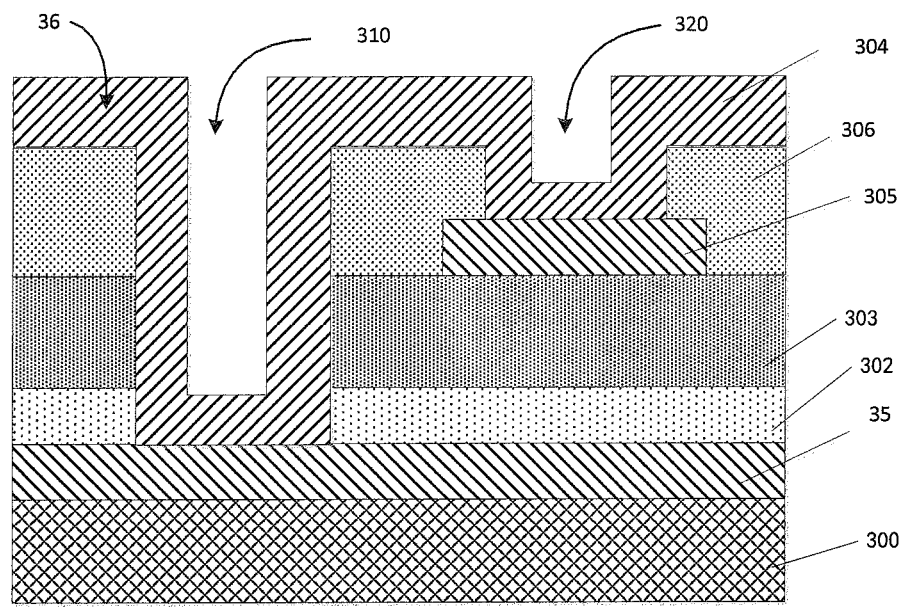
Figure 14:
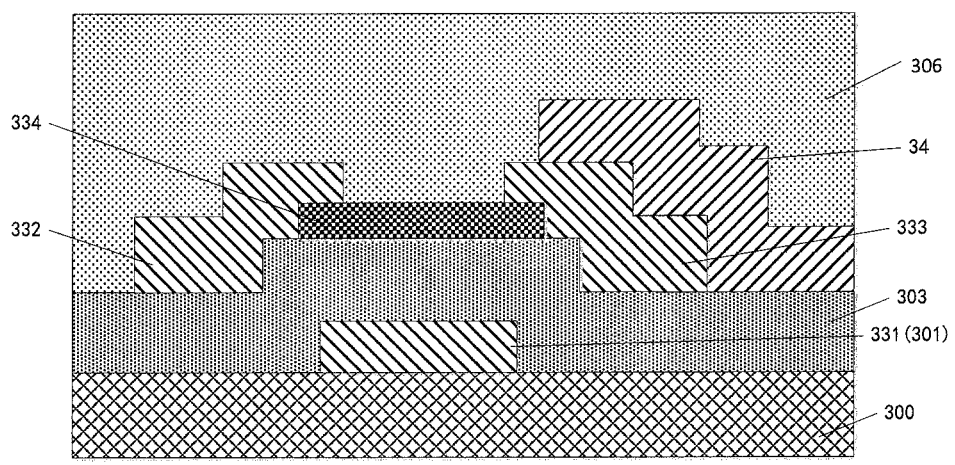

Referring to FIG. 13, a second conductive layer is formed on the second insulation layer 306, and forms an electrical connection with the first fan-out line 35 through the first via-hole 310, and also is connected electrically to the conductive line pattern 305 through the second via-hole 320.

Then, the second conductive layer is patterned to form a second conductive pattern 304. The second conductive pattern 304 can include a second fan-out line 36 and a common electrode 37 (please referring to FIG. 7 together). The second fan-out line 36 is connected electrically to the first fan-out line 35 through the first via-hole 310. The common electrode can include structures including slits.

The second fan-out line 36 is also connected electrically to the conductive line pattern 305 through the second via-hole 320. With the electrical connection to the conductive pattern 305, a resistance of the second fan-out line 36 can be reduced.

As a result, a FFS type array substrate 30 as shown in FIG. 7 is formed.

In another embodiment, the first conductive pattern and the first photoresist pattern can have different profiles. Please referring to FIG. 14, no first photoresist layer is kept back on the gate electrode 331 of the thin film transistor. In the present embodiment, the mask used in patterning of the first conductive layer 301 is a half-tone mask. An example in which the first photoresist layer is made of positive photoresist material is described and explained. A transparent region of the half-tone mask corresponds to a region of the first conductive layer 301 to be removed, a nontransparent region corresponds to the fan-out area (namely a region where the first photoresist layer is required to be kept back), and a semitransparent region corresponds to the rest region of the first conductive layer. The first photoresist pattern and the first conductive pattern are different due to using of the half-tone mask, accordingly, a region to be covered with the first photoresist pattern can be chosen. For example, the first photoresist pattern covers only a first via-hole predefined area corresponding to the fan-out line, and no photoresist pattern is kept back on the gate line and the gate electrode in the display region.

An array substrate according to another embodiment of the present disclosure is a TN type array substrate. The array substrate according to the present embodiment are the substantially same as the array substrate according to the aforementioned embodiment, excepting that, the array substrate according to the present embodiment comprises no common electrode, and the second fan-out line and the pixel electrode are provided in the same layer.

Figure 15A:
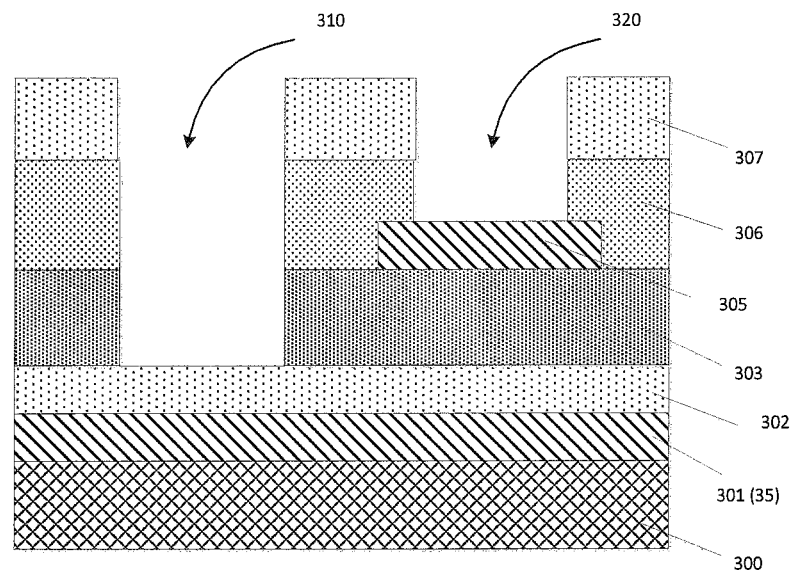
FIGS. 15A-15B, FIGS. 16A-16B, FIGS. 17A-17B, and FIG. 18 are schematic views showing configurations formed in steps of a method of manufacturing an array substrate according to another embodiment of the present disclosure, respectively.
Figure 16A:
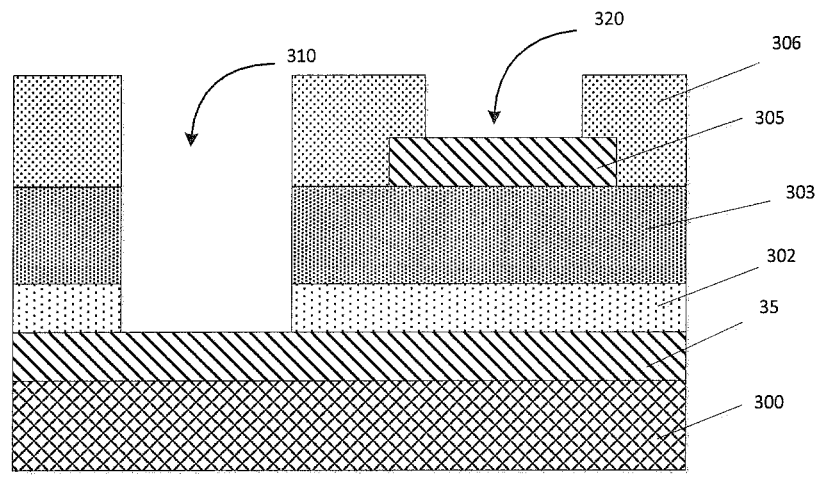
Figure 16B:
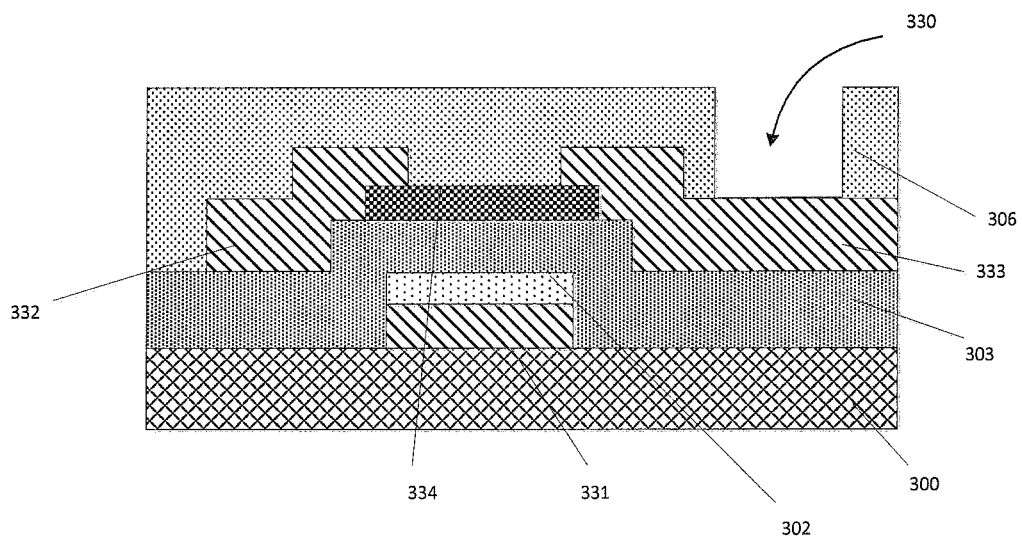
Figure 17A:
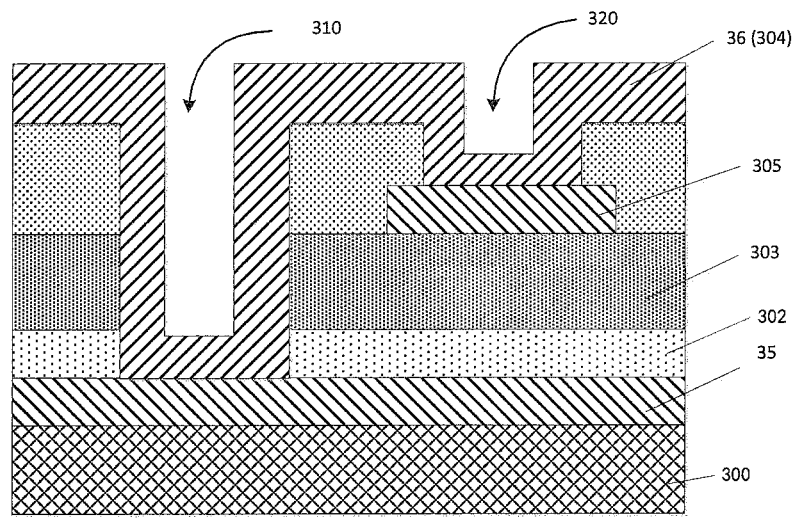
Figure 17B:
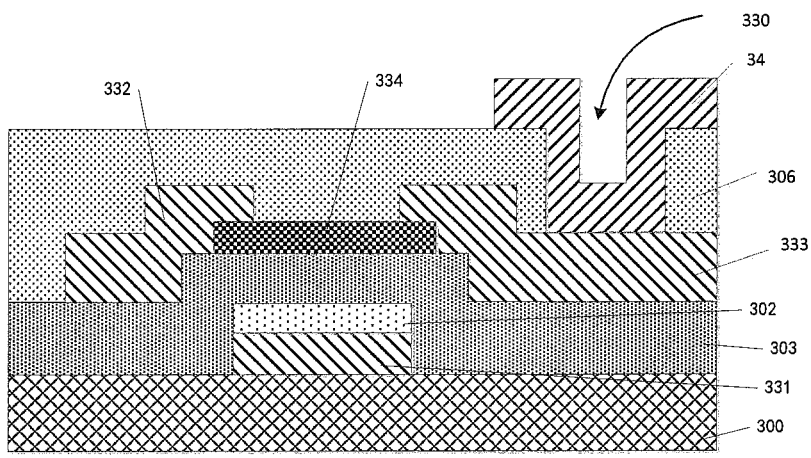

Method of manufacturing an array substrate according to the present embodiment are the substantially same as that according to the aforementioned embodiment. The Method of manufacturing an array substrate according to the present embodiment will be described and illustrated in detail hereinafter with reference to FIGS. 15A-15B, FIGS. 16A-16B, FIGS. 17A-17B, and FIG. 18, excepting some differences steps. Mainly these differences steps are described and illustrated in the followings. FIG. 15A, FIG. 16A, FIG. 17A show the via-hole connection structure within the fan-out area, and FIG. 15B, FIG. 16B, FIG. 17 show structure of a thin film transistor in the display region.

Figure 15B:
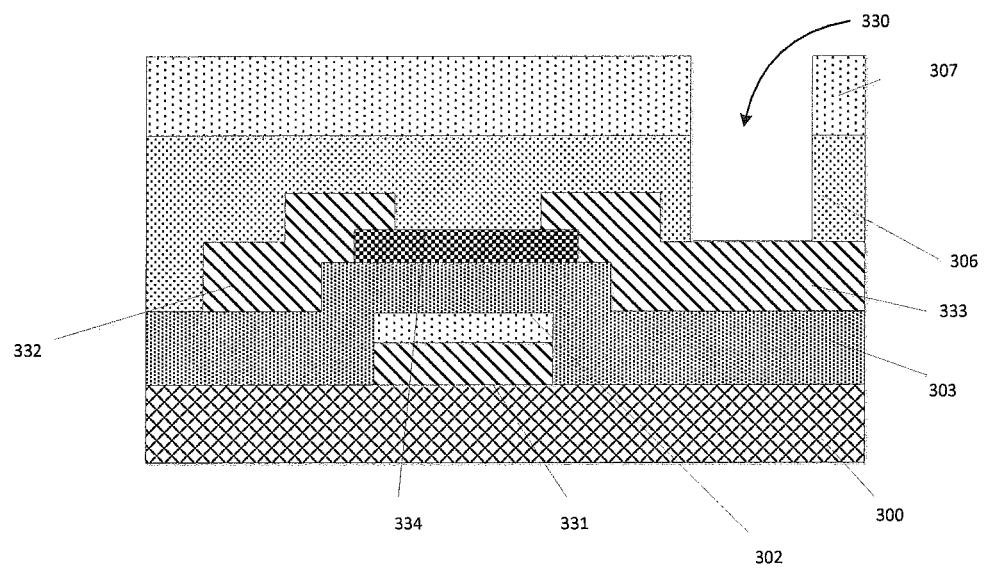

As shown in FIGS. 15A-15B, after forming the third conductive pattern, a second insulation layer 306 is formed and patterned to form a first via-hole 310 in a position of the fan-out area corresponding to the first fan-out line 35, and a third via-hole 330 is formed in a position corresponding to the second electrode 333 of the thin film transistor.

For example, a third photoresist layer is formed on the second insulation layer 306. The third photoresist layer is exposed and developed to form a third photoresist pattern 308. A first via-hole 310 and a third via-hole 330 are formed by etching, with the third photoresist pattern 308 as a mask. The first via-hole 310 is formed within a first via-hole predefined area 310a of the fan-out area (please referring to FIG. 10A together), and runs through the second insulation layer 306 and the first insulation layer 303, and exposes at least a portion of the first photoresist pattern 302. The third via-hole 330 is formed corresponding in position to the second electrode 333 of the thin film transistor, and runs through the second insulation layer 306, and exposes at least a portion of the second electrode 333 of the thin film transistor.

While forming the first via-hole 310 and the third via-hole 330, a second via-hole 320 is formed in a position corresponding to the conductive line pattern 305, runs through the second insulation layer 306, and exposes at least a portion of the conductive line pattern 305. For example, the number of the second via-hole 320 is at least two.

As shown in FIGS. 16A-16B, an ashing process is performed to remove the third photoresist pattern so as to expose the conductive line pattern 305, while removing the first photoresist pattern exposed from the first via-hole 310 so as to expose the first fan-out line 35 therebelow.

As shown in FIGS. 17A-17B, a second conductive layer is formed on the second insulation layer 306. The second conductive layer forms an electrical connection with the first fan-out line 35 through the first via-hole 310, forms an electrical connection with the second electrode 333 of the thin film transistor through the third via-hole 330, and also is connected electrically to the conductive line pattern 305 through the second via-hole 320.

Then, the second conductive layer is patterned to form a second conductive pattern 304. The second conductive pattern 304 at least includes a second fan-out line 36 and a pixel electrode 34. The second fan-out line 36 forms an electrical connection with the first fan-out line 35 through the first via-hole 310. The second fan-out line 36 also forms an electrical connection with the conductive line pattern 305 through the second via-hole 320. For example, the number of the second via-hole 320 is at least two, the second fan-out line 36 is provided to be electrically connected to the conductive line pattern 305 through the at least two second via-holes, so that resistance of the second fan-out line 36 can be reduced. The pixel electrode 34 forms an electrical connection with the second electrode 333 of the thin film transistor through the third via-hole 330.

In one embodiment, the first conductive pattern and the first photoresist pattern have different profiles. Please referring to FIG. 18, no first photoresist layer is kept back on the gate electrode 331 of the thin film transistor. In the present embodiment, the mask used in patterning of the first conductive layer 301 is a half-tone mask. An example in which the first photoresist layer is made of positive photoresist material is described and explained. A transparent region of the half-tone mask corresponds to a region of the first conductive layer to be removed, a nontransparent region corresponds to the fan-out area (namely a region where the first photoresist layer is required to be kept back), and a semitransparent region corresponds to the rest region of the first conductive layer. The first photoresist pattern and the first conductive pattern are different due to using of the half-tone mask, accordingly, a region to be covered with the first photoresist pattern can be chosen. For example, the first photoresist pattern covers only a first via-hole predefined area.

Figure 18:
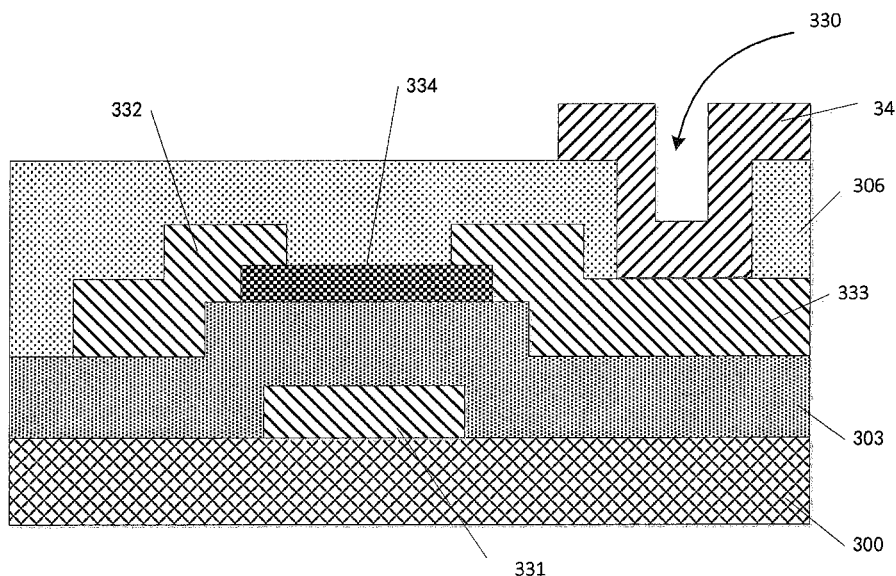

In another embodiment, a structure which is slightly different from that in FIG. 17B or FIG. 18 is that, a common electrode can be formed in the same layer with the pixel electrode, and both the pixel electrode and the common electrode comprise slits for example intersect with each other. As a result, an in-plane switch (IPS) type array substrate is formed, specific steps are omitted for the sake of brevity.

The abovementioned embodiments are described and illustrated by taking a fan-out area where fan-out lines are connected electrically to the gate lines as an example. However, it can be understood by those skilled in the art that, the fan-out area where fan-out lines are connected electrically to the data lines can also adapt similar via-hole connection structures, in this case, the first fan-out line can be made of the same material as and formed by the same patterning process simultaneously as a data line in the display region and a source electrode and a drain electrode of a thin film transistor.

A display device 40 according to an embodiment of the present disclosure is provided. The display device 40 comprises the via-hole connection structure 20 or array substrate 30 according to any of the abovementioned embodiments of the present disclosure. For example, the display device can be a liquid crystal display device, an organic light-emitting diode display device, or an electronic paper display device, and the like.

Figure 19:
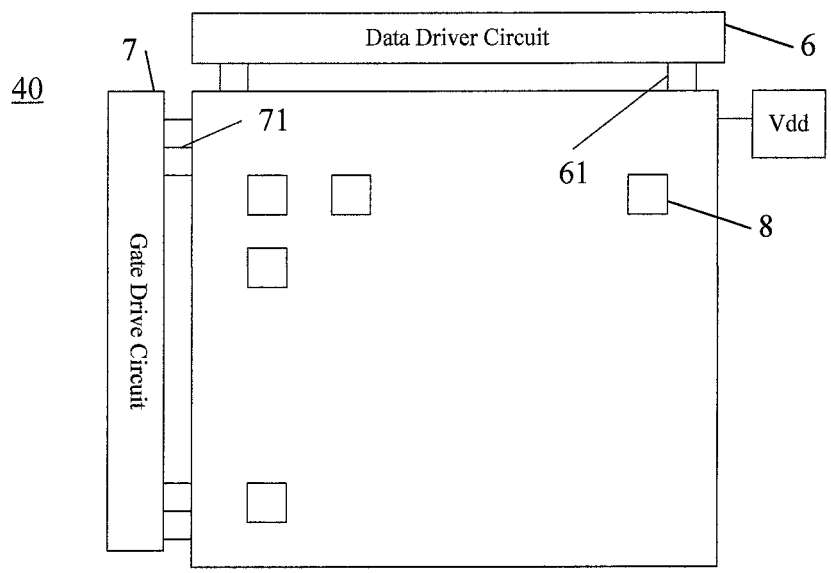
FIG. 19 is a schematic block diagram of a display device according to an embodiment of the present disclosure.

FIG. 19 is a schematic block diagram of a display device 40 according to an embodiment of the present disclosure. For example, the display device 40 is a liquid crystal display device. The liquid crystal display device comprises a plurality of pixel units 8 arranged in a matrix. The display device comprises the via-hole connection structure 20 or array substrate 30 according to any of the abovementioned embodiments of the present disclosure. The display device can further comprise a data driver circuit 6 and a gate driver circuit 7. The data driver circuit 6 is for providing data signals. The gate driver circuit 7 is for providing scan signals (for example signal Vscan), and can also be for providing various control signals. The data driver circuit 6 is connected electrically with the pixel unit 8 through a data line 61, and the gate driver circuit 7 is connected electrically with the pixel unit 8 through a gate line 71. The data driver circuit 6 and the gate driver circuit 7 can be achieved as semiconductor chips.

The display device can further comprise other components/elements, for example, including timing controller, signal decoding circuit, voltage change-over circuit and the likes, and those components/elements can be known conventional ones, which are not described herein for the sake of brevity.

It can be understood by those skilled in the art that, the display device is not limited to a liquid crystal display device, and the via-hole connection structure and the method of manufacturing the same can be applied on other panel display devices, for example, an OLED, a QLED.

It can be understood by those skilled in the art that, the via-hole connection structure and the method of manufacturing the same not only are suitable for these used in an array substrate and in a display device, but also are suitable for those used in any electronic devices as long as the via-hole connection structure comprises a laminated structure including a first conductive layer, an insulation layer and a second conductive layer. All of those should fail into the scope of the present disclosure.

In at least one embodiment of the present disclosure, a photoresist layer formed when patterning the first conductive layer is used to protect the first conductive layer in the etching process for formation of the via-hole from being damaged, meanwhile, the photoresist layer can be removed in a photoresist layer removing process (for example as ashing process) after performing the etching process for formation of the via-hole, thus, an anti-corrosion effect can be achieved without increasing the number of masks.

The above are only specific embodiments of the present disclosure, and the scope of the present disclosure will in no way be limited to the above. It will be apparent for those skilled in the art that various changes and modifications may be made in these embodiments without departing from the principles and spirit of the present disclosure. Thus, the present disclosure intends to contain these changes and modifications if they fall into the scope of the claims and their equivalents of the present disclosure.

What is claimed is:

1. A method of manufacturing a via-hole connection structure, comprising the following steps of:
    forming a first conductive layer on a substrate, and patterning the first conductive layer to form a first conductive pattern on which a first photoresist pattern is provided, the first conductive layer being patterned, by adopting the first photoresist pattern as a mask, to form the first conductive pattern;
    forming a first insulation layer covering the first conductive layer and the first photoresist pattern;
    patterning the first insulation layer to form a first via-hole from which at least a portion of the first photoresist pattern is exposed;
    removing the at least a portion of the first photoresist pattern exposed from the first via-hole; and
    forming a second conductive pattern, wherein the second conductive pattern is electrically connected to the first conductive pattern through the first via-hole.

2. The method of claim 1, wherein the step of patterning the first conductive layer to form a first conductive pattern on which a first photoresist pattern is provided comprising:
    forming a first photoresist layer over the first conductive layer;
    exposing and developing, with a mask, the first photoresist layer to form the first photoresist pattern; and
    etching off a portion of the first conductive layer not being covered by the first photoresist pattern, to form the first conductive pattern being covered by the first photoresist pattern;
    wherein, the first conductive pattern and the first photoresist pattern have the same profile.

3. The method of claim 1, wherein the method further comprises, after the step of forming the first insulation layer and before the step of removing the at least a portion of the first photoresist pattern exposed from the first via-hole, further comprising:
    forming a third conductive pattern and a second insulation layer on the first insulation layer in sequence; and
    patterning the second insulation layer, so as to form the first via-hole running through the first insulation layer and the second insulation layer and a second via-hole running through the second insulation layer, wherein, at least a portion of the first photoresist pattern is exposed from the first via-hole, at least a portion of the third conductive pattern is exposed from the second via-hole, and an orthographic projection of the third conductive pattern onto the substrate is not overlapped with an orthographic projection of the first via-hole onto the substrate; and
    wherein, the step of forming a second conductive pattern further comprises: connecting the second conductive pattern to the first conductive pattern and the third conductive pattern through the first via-hole and the second via-hole, respectively.

4. The method of claim 1, wherein, the step of patterning the first insulation layer comprises:
    forming a second photoresist layer over the first insulation layer;
    exposing and developing the second photoresist layer to form a second photoresist pattern; and
    etching off a portion of the first insulation layer not being covered by the second photoresist pattern, so as to form the first via-hole;
    wherein, the second photoresist pattern is removed while removing the at least a portion of the first photoresist pattern exposed from the first via-hole.

5. The method of claim 3, wherein, the step of patterning the second insulation layer comprises:
    forming a third photoresist layer over the second insulation layer;
    exposing and developing the third photoresist layer so as to form a third photoresist pattern; and
    etching off a portion of the second insulation layer not being covered by the third photoresist pattern, to form the first via-hole and the second via-hole;
    wherein, the third photoresist pattern is removed while removing the at least a portion of the first photoresist pattern exposed from the first via-hole.

6. A method of manufacturing an array substrate, wherein, the array substrate comprises a display region and a peripheral region around the display region, and a via-hole connection structure is within a fan-out area in the peripheral region of the array substrate; and the method comprises: manufacturing the via-hole connection structure by using the method of claim 1.

7. The method of claim 6, wherein, the first conductive pattern at least comprises a first fan-out line made of the same material as and formed by the same patterning process simultaneously as a gate line in the display region and a gate electrode of a thin film transistor in the display region.

8. The method of claim 6, wherein, the second conductive pattern at least comprises a second fan-out line made of the same material as and formed by the same patterning process simultaneously as a pixel electrode or a common electrode in the display region.

9. A method of manufacturing an array substrate, wherein, the array substrate comprises a display region and a peripheral region around the display region, and a via-hole connection structure is within a fan-out area in the peripheral region of the array substrate; and the method comprises: manufacturing the via-hole connection structure by using the method of claim 3.

10. The method of claim 9, wherein, the third conductive pattern is made of the same material as and is formed by the same patterning process simultaneously as a source electrode and a drain electrode of a thin film transistor in the display region.

11. The method of claim 10, wherein, the second conductive pattern is made of the same material as and is formed by the same patterning process simultaneously as a pixel electrode or a common electrode in the display region; a third via-hole is formed while forming the first via-hole and the second via-hole, the third via-hole runs through the second insulation layer and exposes at least a portion of the source electrode or the drain electrode, and the pixel electrode is electrically connected to the at least a portion of the source electrode or the drain electrode through the third via-hole.

12. A method of manufacturing a via-hole connection structure, comprising the following steps of:
forming a first conductive layer on a substrate, and patterning the first conductive layer to form a first conductive pattern on which a half-tone photoresist pattern is provided, the first conductive layer being patterned, by adopting the half-tone photoresist pattern as a mask, to form the first conductive pattern;
ashing the half-tone photoresist pattern, so as to form a first photoresist pattern covering at least a portion of the first conductive pattern;
forming a first insulation layer covering the first conductive layer and the first photoresist pattern;
patterning the first insulation layer to form a first via-hole from which at least a portion of the first photoresist pattern is exposed;
removing the at least a portion of the first photoresist pattern exposed from the first via-hole; and
forming a second conductive pattern, wherein the second conductive pattern is electrically connected to the first conductive pattern through the first via-hole.

13. The method of claim 12, wherein, the step of patterning the first conductive layer to form a first conductive pattern on which a first photoresist pattern is provided comprising:
forming a first photoresist layer over the first conductive layer;
exposing and developing, with a half-tone mask, the first photoresist layer to form a half-tone photoresist pattern; and etching off a portion of the first conductive layer not being covered by the half-tone photoresist pattern, to form the first conductive pattern being covered by the half-tone photoresist pattern;
wherein, the first conductive pattern and the first photoresist pattern have different profiles, and a half-tone area of the half-tone mask at least corresponds to a portion of the first conductive pattern not being covered by the first photoresist pattern.

14. The method of claim 12, wherein the method further comprises, after the step of forming the first insulation layer and before the step of removing the at least a portion of the first photoresist pattern exposed from the first via-hole, further comprising:
forming a third conductive pattern and a second insulation layer on the first insulation layer in sequence; and
patterning the second insulation layer, so as to form the first via-hole running through the first insulation layer and the second insulation layer and a second via-hole running through the second insulation layer, wherein, at least a portion of the first photoresist pattern is exposed from the first via-hole, at least a portion of the third conductive pattern is exposed from the second via-hole, and an orthographic projection of the third conductive pattern onto the substrate is not overlapped with an orthographic projection of the first via-hole onto the substrate; and
wherein, the step of forming a second conductive pattern further comprises: connecting the second conductive pattern to the first conductive pattern and the third conductive pattern through the first via-hole and the second via-hole, respectively.

15. The method of claim 12, wherein, the step of patterning the first insulation layer comprises:
forming a second photoresist layer over the first insulation layer;
exposing and developing the second photoresist layer to form a second photoresist pattern; and
etching off a portion of the first insulation layer not being covered by the second photoresist pattern, so as to form the first via-hole;
wherein, the second photoresist pattern is removed while removing the at least a portion of the first photoresist pattern exposed from the first via-hole.

16. The method of claim 12, wherein, the step of patterning the second insulation layer comprises:
forming a third photoresist layer over the second insulation layer;
exposing and developing the third photoresist layer so as to form a third photoresist pattern; and
etching off a portion of the second insulation layer not being covered by the third photoresist pattern, to form the first via-hole and the second via-hole;
wherein, the third photoresist pattern is removed while removing the at least a portion of the first photoresist pattern exposed from the first via-hole.

* * * * *